United States Patent
Go et al.

(10) Patent No.: US 11,239,452 B2
(45) Date of Patent: Feb. 1, 2022

(54) DISPLAY APPARATUS HAVING TREATMENT AREAS AND METHOD OF MANUFACTURING THE SAME

(71) Applicant: Samsung Display Co., Ltd., Yongin-si (KR)

(72) Inventors: Jaekyung Go, Yongin-si (KR); Youngmin Kim, Yongin-si (KR); Yongseung Park, Yongin-si (KR); Yongjun Park, Yongin-si (KR); Seonggeun Won, Yongin-si (KR); Jawoon Lee, Yongin-si (KR); Minjun Jo, Yongin-si (KR); Hyunmin Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/706,415

(22) Filed: Dec. 6, 2019

(65) Prior Publication Data

US 2020/0185661 A1 Jun. 11, 2020

(30) Foreign Application Priority Data

Dec. 11, 2018 (KR) .......................... 10-2018-0159091

(51) Int. Cl.
*H01L 51/56* (2006.01)
*H01L 27/32* (2006.01)
*H01L 51/00* (2006.01)

(52) U.S. Cl.
CPC .......... *H01L 51/56* (2013.01); *H01L 27/3223* (2013.01); *H01L 27/3258* (2013.01); *H01L 27/3276* (2013.01); *H01L 51/0017* (2013.01); *H01L 51/0021* (2013.01)

(58) Field of Classification Search
CPC . H01L 51/56; H01L 27/3258; H01L 51/0021; H01L 27/3223
See application file for complete search history.

(56) References Cited

U.S. PATENT DOCUMENTS

| | | | |
|---|---|---|---|
| 6,822,725 B2 | 11/2004 | Choo et al. | |
| 8,053,293 B2 | 11/2011 | Kim et al. | |
| 8,988,627 B2 | 3/2015 | Tae et al. | |
| 11,019,743 B2* | 5/2021 | Choi | ........................ H01L 51/56 |
| 2005/0170641 A1* | 8/2005 | Kondo | .............. H01L 23/53295 |
| | | | 438/633 |
| 2005/0245069 A1* | 11/2005 | Shepard | .............. H01L 51/0096 |
| | | | 438/626 |

(Continued)

FOREIGN PATENT DOCUMENTS

| | | |
|---|---|---|
| KR | 10-0514075 B1 | 11/2005 |
| KR | 10-2008-0008704 A | 1/2008 |

(Continued)

*Primary Examiner* — Caleb E Henry
(74) *Attorney, Agent, or Firm* — Lewis Roca Rothgerber Christie LLP

(57) ABSTRACT

A display apparatus includes: a substrate and a display portion on the substrate; a first treatment area including a first treatment surface on at least one side surface of the substrate; and a second treatment area adjacent the first treatment area and including a second treatment surface having a different shape from the first treatment surface of the first treatment surface.

12 Claims, 20 Drawing Sheets

(56) References Cited

U.S. PATENT DOCUMENTS

| | | | | |
|---|---|---|---|---|
| 2009/0267192 | A1* | 10/2009 | Anderson | H01L 21/31053 |
| | | | | 257/618 |
| 2018/0069063 | A1* | 3/2018 | Kim | G02F 1/136213 |
| 2019/0067630 | A1* | 2/2019 | Hwang | H01L 51/5246 |
| 2020/0274109 | A1* | 8/2020 | Kim | H01L 51/0017 |

FOREIGN PATENT DOCUMENTS

| KR | 10-2013-0017876 A | 2/2013 |
|---|---|---|
| KR | 10-2017-0133582 A | 12/2017 |
| KR | 10-1818449 B1 | 1/2018 |
| KR | 10-1850151 B1 | 4/2018 |

\* cited by examiner

DISPLAY APPARATUS HAVING TREATMENT AREAS AND METHOD OF MANUFACTURING THE SAME

CROSS-REFERENCE TO RELATED APPLICATION

This application claims priority to and the benefit of Korean Patent Application No. 10-2018-0159091, filed on Dec. 11, 2018, in the Korean Intellectual Property Office, the disclosure of which is incorporated herein in its entirety by reference.

BACKGROUND

1. Field

Aspects of one or more embodiments relate to a display apparatus and a method of manufacturing the same.

2. Description of the Related Art

Recently, the use of display apparatuses has become diverse. In particular, the thicknesses and weights of the display apparatuses have decreased, and thus, the range of the use thereof is wide.

A display apparatus enables the graphical display of images and may include one or more display devices.

In addition, a display apparatus may include one or more conductive layers or insulating layers connected to a display device adjacent thereto. In this way, a display apparatus includes a plurality of components and thus may be manufactured via a plurality of complicated processes.

Also, while a plurality of processes are performed during the manufacture of the display apparatus, defects or impurities may be introduced during the manufacturing process, which may result in degraded picture quality characteristics of the display apparatus.

The above information disclosed in this Background section is only for enhancement of understanding of the background and therefore it may contain information that does not constitute prior art.

SUMMARY

One or more embodiments include a display apparatus having improved electrical characteristics and picture quality characteristics and a method of manufacturing the display apparatus that improves the efficiency of a manufacturing process.

Additional aspects will be set forth in part in the description which follows and, in part, will be apparent from the description, or may be learned by practice of the presented embodiments.

According to some example embodiments of the present disclosure, a display apparatus includes: a substrate and a display portion on the substrate; a first treatment area including a first treatment surface on at least one side surface of the substrate; and a second treatment area to be connected to the first treatment area and including a second treatment surface having a different shape from that of the first treatment surface.

According to some example embodiments, the first treatment surface and the second treatment surface may be directly connected to each other.

According to some example embodiments, the first treatment surface and the second treatment surface may correspond to a whole thickness of the substrate.

According to some example embodiments, the first treatment surface and the second treatment surface may be formed using different treatment methods.

According to some example embodiments, the display apparatus may further include one or more insulating layers formed on the substrate, wherein the first treatment surface or the second treatment surface is connected to the one or more insulating layers.

According to some example embodiments, the display apparatus may further include one or more conductive layers formed on the substrate, wherein the first treatment surface or the second treatment surface is connected to the one or more conductive layers.

According to some example embodiments, the second treatment surface may include a center treatment surface and a connection treatment surface that is closer to a top surface on which the display portion is positioned than the center treatment surface, among side surfaces of the substrate, and the connection treatment surface may be inclined with respect to the center treatment surface at a certain angle.

According to some example embodiments, a plurality of second treatment areas may be formed.

According to some example embodiments, two second treatment areas among the plurality of second treatment areas may be at both sides of the first treatment area between the two second treatment areas.

According to some example embodiments, a peripheral area may be on the substrate and may not overlap the display area, and the first treatment area and the second treatment area may correspond to the peripheral area.

According to some example embodiments, one or more pad portions may be in the peripheral area.

According to some example embodiments, a wiring portion may be in the peripheral area and may include one or more wiring members.

According to one or more example embodiments of the present disclosure, in a method of manufacturing a display apparatus including a substrate and a display portion on the substrate, the method includes: forming a first treatment area including a first treatment surface on at least one side surface of the substrate; and forming a second treatment area to be connected to the first treatment area, the second treatment area including a second treatment surface having a different shape from that of the first treatment surface.

According to some example embodiments, the first treatment surface and the second treatment surface may be formed using different treatment methods.

According to some example embodiments, the forming of the first treatment surface may include a laser treatment process.

According to some example embodiments, the forming of the second treatment surface may include a polishing process.

According to some example embodiments, after the first treatment area is formed, the second treatment area may be formed to include at least one region of the first treatment area.

According to some example embodiments, the method may further include: preparing a display apparatus preparatory structure including a dummy area on the substrate; and removing the dummy area based on a cutting line for the display apparatus preparatory structure.

According to some example embodiments, the first treatment area may be formed in the removing of the dummy area based on the cutting line, and the second treatment area may be formed after the forming of the first treatment area.

According to some example embodiments, the method may further include, before the removing of the dummy area, performing an inspection process using the dummy area.

BRIEF DESCRIPTION OF THE DRAWINGS

These and/or other aspects will become more apparent and more readily appreciated from the following description of the embodiments, taken in conjunction with the accompanying drawings in which.

DETAILED DESCRIPTION

Figure 1:
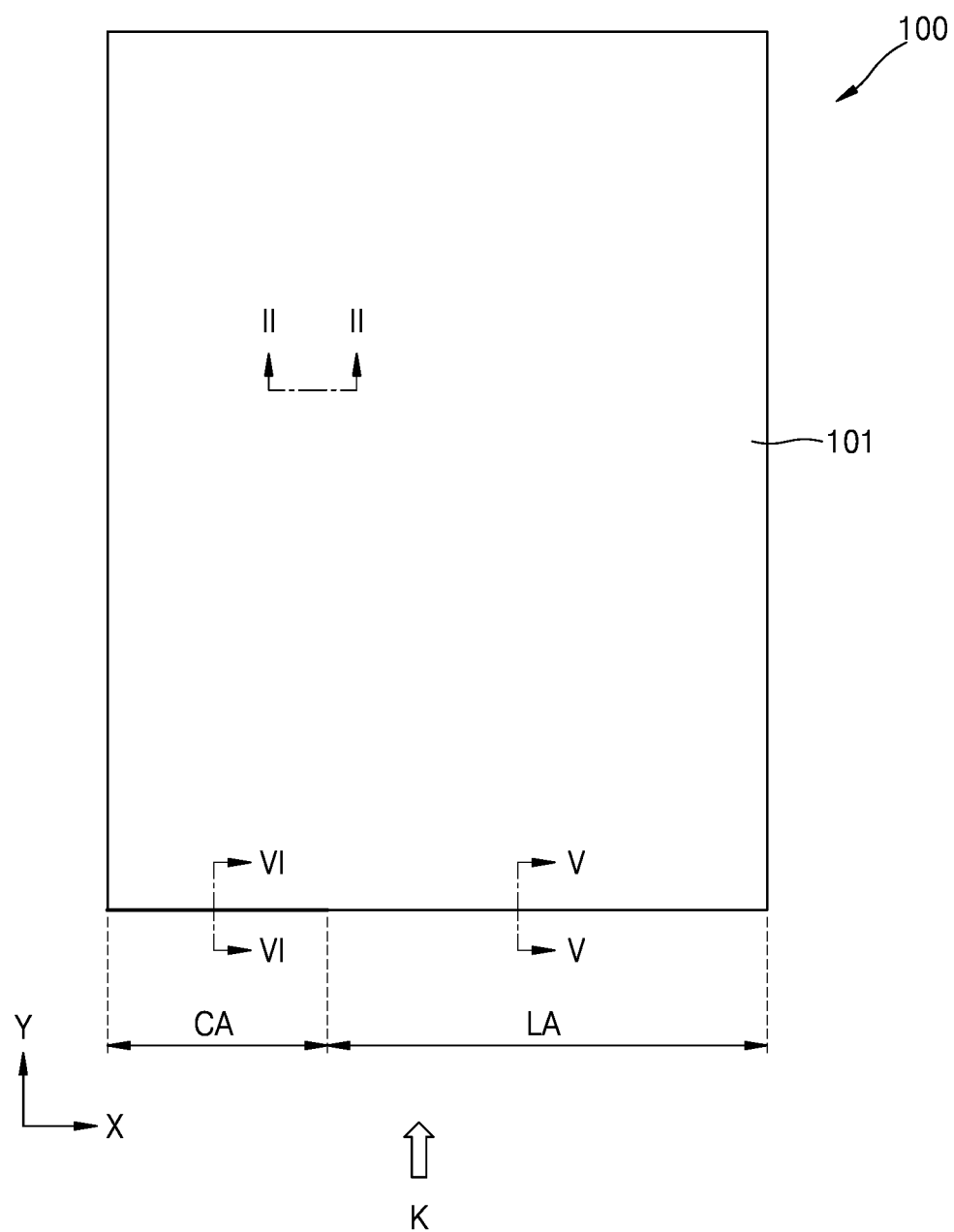
FIG. 1 is a plan view illustrating a display apparatus according to some example embodiments.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the present disclosure allows for various changes and numerous embodiments, example embodiments will be illustrated in the drawings and described in detail in the written description. The effects and features of the present disclosure, and ways to achieve them will become apparent by referring to embodiments that will be described later in detail with reference to the drawings. However, the present disclosure is not limited to the following embodiments but may be embodied in various forms.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it may be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Hereinafter, aspects of some example embodiments of the present disclosure will be described below in more detail with reference to the accompanying drawings. Those components that are the same or are in correspondence are rendered the same reference numeral regardless of the figure number.

Figure 2:
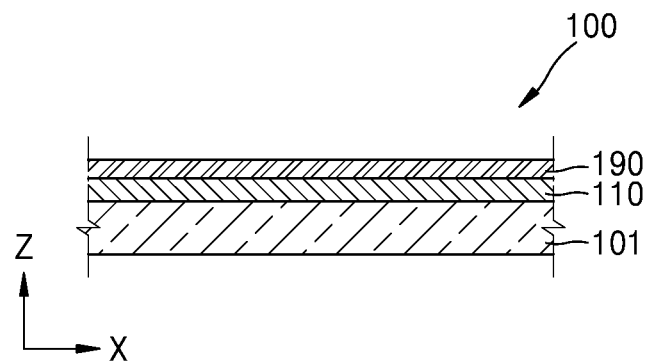
FIG. 2 is a cross-sectional view taken along a line II-II of FIG. 1.
Figure 3:
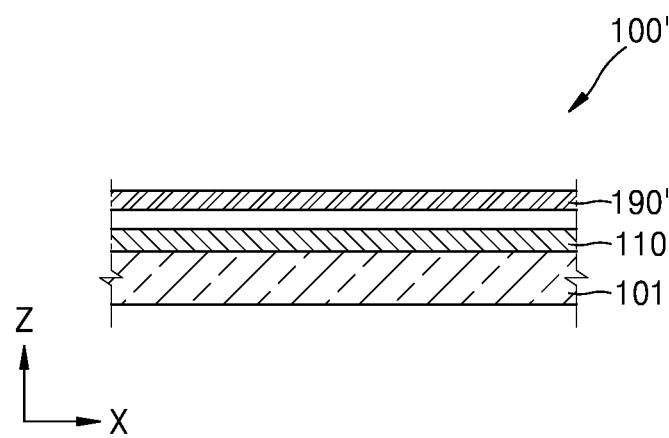
FIG. 3 is a view illustrating a modified embodiment of FIG. 2.

FIG. 1 is a plan view illustrating a display apparatus according to some example embodiments, FIG. 2 is a cross-sectional view taken along a line II-II of FIG. 1, and FIG. 3 is a view illustrating a modified embodiment of FIG. 2.

Figure 4:
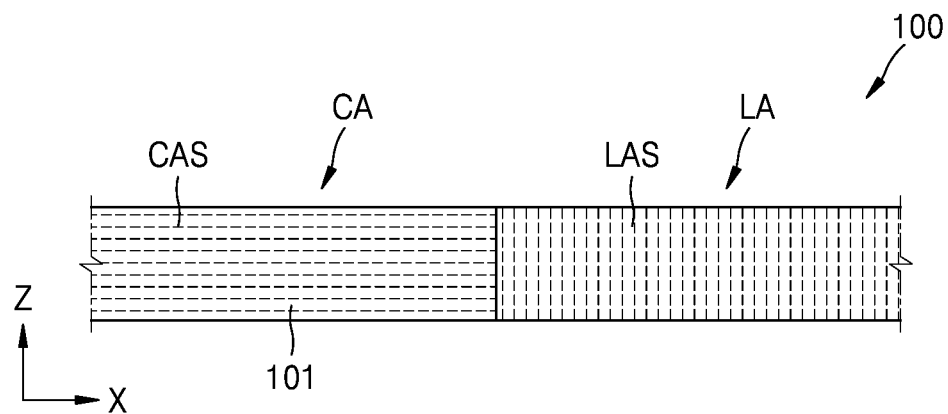
FIG. 4 is a view from a region K of FIG. 1.
Figure 5:
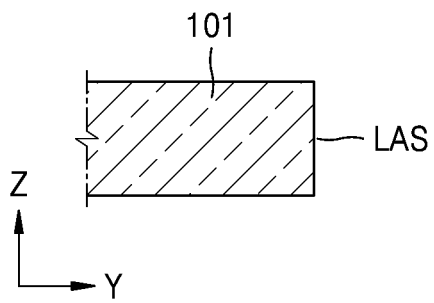
FIG. 5 is a cross-sectional view taken along a line V-V of FIG. 1.
Figure 6:
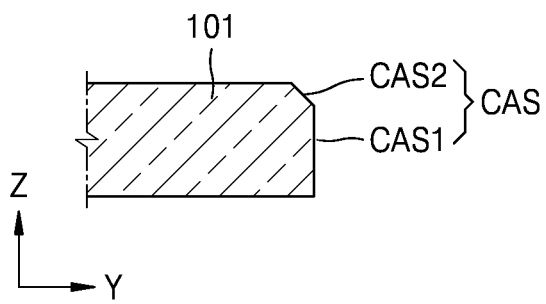
FIG. 6 is a cross-sectional view taken along a line VI-VI of FIG. 1.
Figure 7:
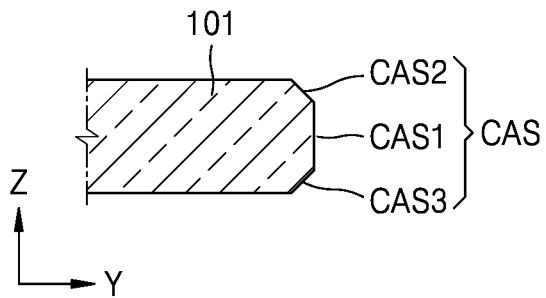
FIG. 7 is a view illustrating a modified embodiment of FIG. 6.

FIG. 4 is a view from a region K of FIG. 1, FIG. 5 is a cross-sectional view taken along a line V-V of FIG. 1, FIG. 6 is a cross-sectional view taken along a line VI-VI of FIG. 1, and FIG. 7 is a view illustrating a modified embodiment of FIG. 6.

Referring to FIGS. 1 through 7, a display apparatus 100 may include a substrate 101, a display portion 110, a first treatment area LA, and a second treatment area CA.

The substrate 101 may be formed using various transparent or opaque materials.

According to some example embodiments, the substrate 101 may be formed of glass, metal, or other organic materials.

Also, according to some example embodiments, the substrate 101 may be formed of flexible, bendable, foldable, or rollable materials.

Also, according to some example embodiments, flexible materials for forming the substrate 101 may include thin glass, metal, or plastics.

According to some example embodiments, the substrate 101 may include polyimide (PI), and according to some example embodiments, the substrate 101 may include different types of plastic material.

The display portion (or display) 110 is formed or positioned on the substrate 101. The display portion 110 may include one or more display devices and may be used to recognize an image by a user. These display devices may include various shapes and types of devices, for example, an organic light-emitting device (OLED) including a first electrode, a second electrode, and an organic emission layer.

According to some example embodiments, an encapsulation portion 190 may be formed on the display portion 110 to protect the display portion 110. Also, the encapsulation portion 190 may be formed to cover or seal the display portion 110 to protect the display portion 110 and may prevent or reduce instances of moisture or gas penetrating into the display portion 110.

According to some example embodiments, the encapsulation portion 190 may be formed to have a shape of a thin film, for example, may include one layer or a plurality of layers.

According to some example embodiments, the encapsulation portion 190 may include one or more layers including an inorganic material such as silicon oxide or silicon nitride and one or more layers including an organic material such as epoxy or polyimide. According to some example embodiments, the encapsulation portion 190 may also include a structure in which a layer including the inorganic material and a layer including the organic material are alternately stacked.

In addition, as shown in FIG. 3, a display apparatus 100' may include a substrate 101, a display portion 110, and an encapsulation substrate 190'.

The encapsulation substrate 190' may be positioned to face the substrate 101, and the display portion 110 may be positioned between the substrate 101 and the encapsulation substrate 190'.

The encapsulation substrate 190' may be formed of various materials, for example, light-transmitting materials.

Also, according to some example embodiments, when light is realized in a direction of the substrate 101, the encapsulation substrate 190' may also be formed of opaque materials.

A sealing portion may be positioned between the substrate 101 and the encapsulation substrate 190' to couple the substrate 101 to the encapsulation substrate 190'. For example, a space between the substrate 101 and the encapsulation substrate 190' may be sealed by the sealing portion. According to some example embodiments, a moisture absorbent or filling material may be placed in the sealed space.

The first treatment area LA and the second treatment area CA may correspond to at least one side surface of the substrate 101.

For example, when a surface of the substrate 101, on which a display portion 110 is formed, is referred to as a "top surface" and an opposite surface thereto is referred to as a "bottom surface", surfaces between the "top surface" and the "bottom surface" may be referred to as "side surfaces".

According to some example embodiments, the first treatment area LA and the second treatment area CA may be positioned at one side surface of the substrate 101, and the second treatment area CA may be positioned adjacent to the first treatment area LA so as to be connected to the first treatment area LA.

According to some example embodiments, the first treatment area LA and the second treatment area CA may be formed to correspond to the whole one side surface of the substrate 101.

The first treatment area LA and the second treatment area CA may have lengths, for example, lengths based on a lengthwise direction of one side surface of the substrate 101 (the X-axis direction of FIG. 1). According to some example embodiments, the length of the first treatment area LA may be greater than the length of the second treatment area CA.

The first treatment area LA may include a first treatment surface LAS. The first treatment surface LAS may correspond to the whole thickness direction (the Z-axis direction of FIG. 4) of the substrate 101.

The first treatment surface LAS may be an area processed using various methods and may include a laser-processed area, for example. According to some example embodiments, the first treatment surface LAS may include a laser-cutting area with respect to the substrate 101 and may include a cutting cross-section during laser cutting.

According to some example embodiments, the first treatment surface LAS may include regular or irregular patterns and linear patterns, for example. According to some example embodiments, the first treatment surface LAS may include linear patterns formed along the thickness direction (the Z-axis direction of FIG. 4) of the substrate 101.

The second treatment area CA may include a second treatment surface CAS. The second treatment surface CAS may be adjacent to the first treatment surface LAS and may be directly connected thereto.

The second treatment surface CAS may correspond to the whole thickness direction (the Z-axis direction of FIG. 4) of the substrate 101.

The second treatment surface CAS may be an area processed using various methods and may include a polished area, for example. According to some example embodiments, the second treatment surface CAS may include a polished area processed with respect to the substrate 101 using a polishing member.

According to some example embodiments, the second treatment surface CAS may include a polished area processed with respect to the substrate 101 using a computer numerical control (CNC) polishing process.

Also, according to some example embodiments, the second treatment surface CAS may be an area on which a treatment process with respect to the cross-section of a cutting area is performed.

According to some example embodiments, the second treatment surface CAS may include regular or irregular patterns, for example, linear patterns. According to some example embodiments, the second treatment surface CAS may include linear patterns formed along a direction that crosses the thickness direction (the Z-axis direction of FIG. 4) of the substrate 101.

According to some example embodiments, as shown in FIG. 6, the second treatment area CA may include the second treatment surface CAS, and the second treatment surface CAS may include a center treatment surface CAS1 and a connection treatment surface CAS2.

The center treatment surface CAS1 may be formed closer to a center axis than the connection treatment surface CAS2 based on the thickness direction of the substrate 101. According to some example embodiments, the center treatment surface CAS1 may overlap the center axis based on the thickness direction of the substrate 101.

The connection treatment surface CAS2 may be formed closer to the top surface of the substrate 101 (i.e., a surface of the substrate 101 on which the display portion 110 is formed) than the center treatment surface CAS1. For example, the connection treatment surface CAS2 may be connected to the top surface of the substrate 101 and may be between the top surface of the substrate 101 and the center treatment surface CAS1.

An angle formed between the center treatment surface CAS1 and the top surface of the substrate 101, and an angle formed between the connection treatment surface CAS2 and the top surface of the substrate 101 may be different from each other. For example, an angle formed between the top surface of the substrate 101 and an extension line of the center treatment surface CAS1 may be about 90 degrees, and an angle formed between the top surface of the substrate 101 40 and the connection treatment surface CAS2 may be greater than 90 degrees, according to some example embodiments, may be between 110 and 170 degrees.

For example, the connection treatment surface CAS2 may include an inclined surface inclined with respect to the top surface of the substrate 101.

According to some example embodiments, the connection treatment surface CAS2 may also include a curved surface.

According to some example embodiments, as shown in FIG. 7, the second treatment area CA may include a second treatment surface CAS, and the second treatment surface CAS may include a center treatment surface CAS1, a first connection treatment surface CAS2, and a second connection treatment surface CAS3.

Because the center treatment surface CAS1 and the first connection treatment surface CAS2 may be the same as or modified in a similar way to the center treatment surface CAS1 and the connection treatment surface CAS2 of FIG. 6 described above, only a second connection treatment surface CAS3 will be described.

The second connection treatment surface CAS3 may be formed closer to the bottom surface of the substrate 101 (i.e., an opposite surface to the top surface) among surfaces of the substrate 101 on which the display portion 110 is formed, than the center treatment surface CAS1. For example, the second connection treatment surface CAS3 may be connected to the bottom surface of the substrate 101 and may be formed between the bottom surface of the substrate 101 and the center treatment surface CAS1.

An angle formed between the center treatment surface CAS1 and the bottom surface of the substrate 101, and an angle formed between the second connection treatment surface CAS3 and the bottom surface of the substrate 101 may be different from each other. For example, an angle formed between the bottom surface of the substrate 101 and the extension line of the center treatment surface CAS1 may be about 90 degrees, and an angle formed between the bottom surface of the substrate 101 and the second connection treatment surface CAS3 may be greater than 90 degrees, according to some example embodiments, an angle between 110 and 170 degrees.

For example, the second connection treatment surface CAS3 may include an inclined surface inclined with respect to the bottom surface of the substrate 101.

according to some example embodiments, the second connection treatment surface CAS3 may include a curved surface.

The display apparatus according to some example embodiments may include a substrate, a display portion, a first treatment area, and a second treatment area. Each of the first treatment area and the second treatment area may correspond to at least one side surface of the substrate and may include the first treatment area and the second treatment area.

In addition, the first treatment surface and the second treatment surface may have different shapes and may include surfaces formed using different treatment methods, for example. Thus, when various members are positioned in an area adjacent to side surfaces of the substrate of the display apparatus, the first treatment surface and the second treatment surface may be formed according to characteristics of members to be positioned so that a precise design in the area adjacent to the side surfaces of the substrate may be easily realized, manufacturing and inspection of the display apparatus may be easily performed and a display quality may be improved.

In addition, according to some example embodiments, the first treatment surface may include a laser-treated area, smooth cutting using laser may be performed on the second treatment surface by including the polished area, and precise ends of a certain place may be easily performed through polishing.

In addition, according to some example embodiments, laser cutting may be performed on one side surface of the substrate overall, and polishing may be performed on a certain portion of the substrate so that, for example, after the first treatment surface is formed on the whole one side surface of the substrate, polishing may be performed to convert a part of the first treatment surface into a second treatment surface.

Thus, the display apparatus including the first treatment surface and the second treatment surface may be easily formed.

Figure 8:
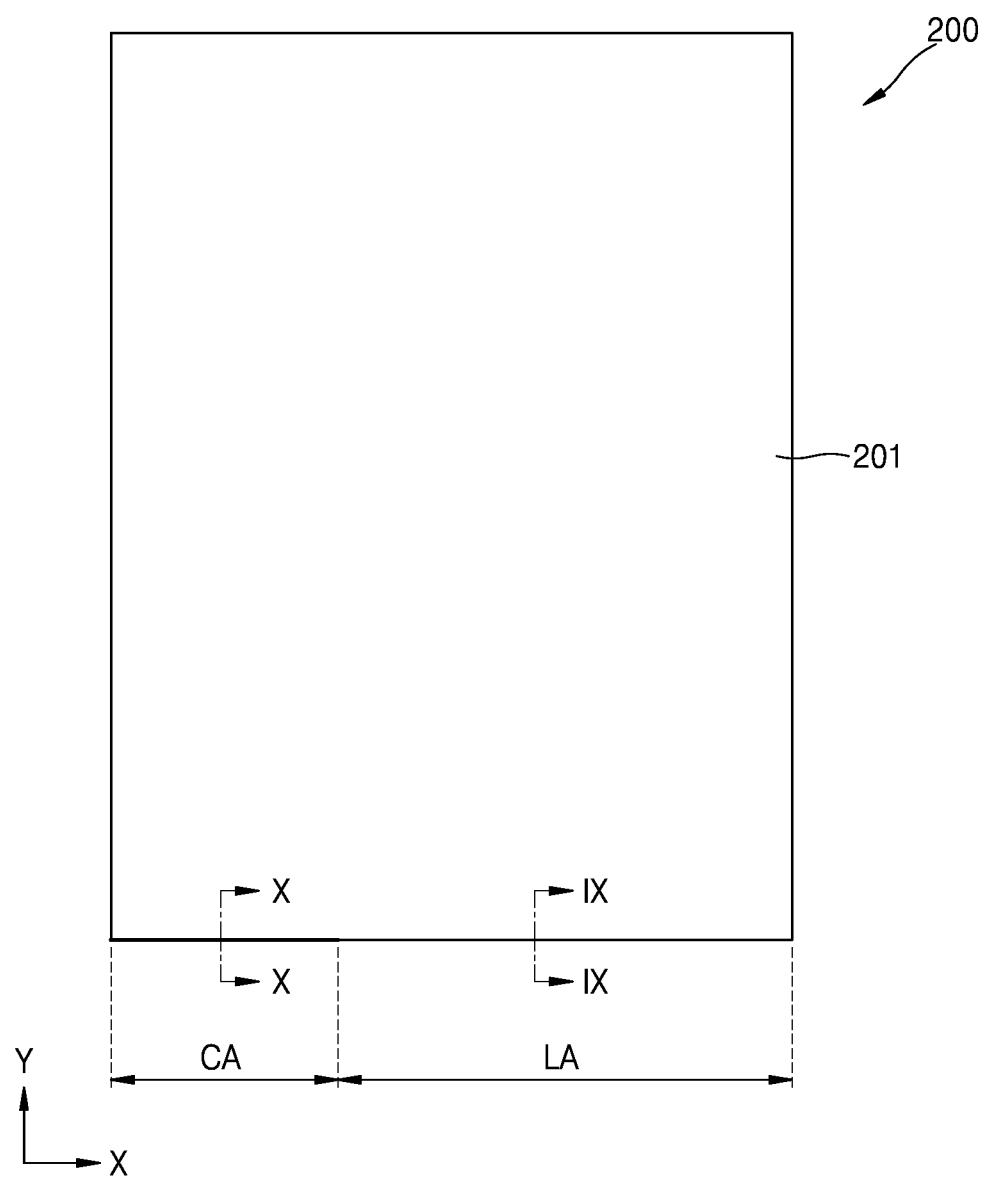
FIG. 8 is a plan view illustrating a display apparatus according to some example embodiments.
Figure 9:
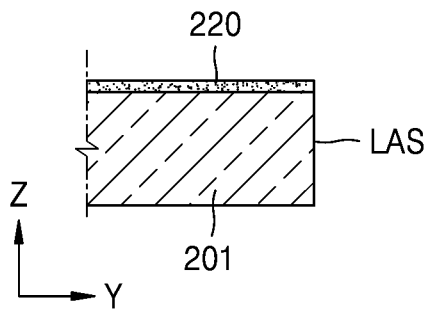
FIG. 9 is a cross-sectional view taken along a line IX-IX of FIG. 8.
Figure 10:
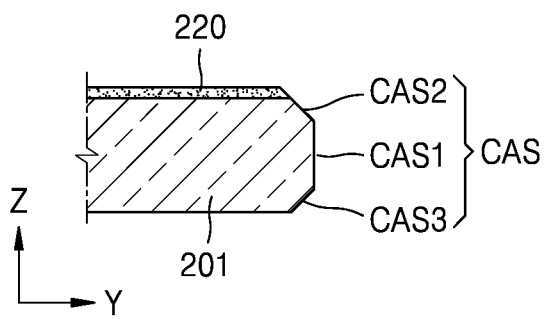
FIG. 10 is a cross-sectional view taken along a line X-X of FIG. 8.
Figure 11:
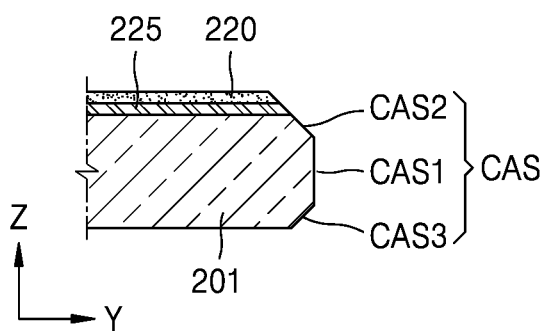
FIG. 11 is a view illustrating a modified embodiment of FIG. 10.

FIG. 8 is a plan view illustrating a display apparatus according to some example embodiments, FIG. 9 is a cross-sectional view taken along a line IX-IX of FIG. 8, FIG. 10 is a cross-sectional view taken along a line X-X of FIG. 8, and FIG. 11 is a view illustrating a modified embodiment of FIG. 10.

Referring to FIGS. 8 through 10, a display apparatus 200 may include a substrate 201, a display portion, a first treatment area LA, and a second treatment area CA.

The substrate 201 may be formed using various transparent or opaque materials.

A description of the substrate 201 may be the same as or modified in a similar way to that of the above-described embodiment and thus, a detailed description thereof is omitted.

The display portion is formed on the substrate 201. The display portion may include one or more display devices and may be used to recognize an image by the user. These display devices may include various shapes and types of devices, for example, an OLED including a first electrode, a second electrode, and an organic emission layer.

According to some example embodiments, an encapsulation portion may be formed on the display portion to protect the display portion. The encapsulation portion may be formed to have a shape of a thin film, for example, may include one layer or a plurality of layers.

Also, in a modified embodiment, an encapsulation substrate may be positioned on an upper portion of the display portion to correspond to the substrate 201.

The first treatment area LA and the second treatment area CA may correspond to at least one side surface of the substrate 201.

For example, when a surface of the substrate 201, on which a display portion 210 is formed, is referred to as a "top surface" and an opposite surface thereto is referred to as a "bottom surface", surfaces between the "top surface" and the "bottom surface" may be referred to as "side surfaces".

According to some example embodiments, the first treatment area LA and the second treatment area CA may be positioned at one side surface of the substrate 201, and the second treatment area CA may be positioned adjacent to the first treatment area LA so as to be connected to the first treatment area LA.

According to some example embodiments, the first treatment area LA and the second treatment area CA may be formed to correspond to the whole one side surface of the substrate 201.

The first treatment area LA and the second treatment area CA may have lengths, for example, lengths based on a lengthwise direction of one side surface of the substrate 201 (the X-axis direction of FIG. 8). According to some example embodiments, the length of the first treatment area LA may be greater than the length of the second treatment area CA.

The first treatment area LA may include a first treatment surface LAS. The first treatment surface LAS may correspond to the whole thickness direction (the Z-axis direction of FIG. 9) of the substrate 201.

According to some example embodiments, the first treatment surface LAS may correspond to one or more insulating layers 220 formed on the substrate 201. For example, the first treatment surface LAS may extend to side surfaces of the substrate 201 and side surfaces of the insulating layer 220.

The insulating layer 220 may include a plurality of layers, for example, inorganic layers or organic layers selectively.

According to some example embodiments, the first treatment surface LAS may be formed to correspond to at least one area of one or more conductive layers formed on the substrate 201.

The first treatment surface LAS may be an area processed using various methods and may include a laser-processed area, for example. According to some example embodiments, the first treatment surface LAS may include a laser-cutting area with respect to the substrate 201 and may include a cutting cross-section during laser cutting.

According to some example embodiments, the first treatment surface LAS may include regular or irregular patterns and linear patterns, for example. According to some example embodiments, the first treatment surface LAS may include linear patterns formed along the thickness direction (the Z-axis direction of FIG. 9) of the substrate 201.

The second treatment area CA may include a second treatment surface CAS. The second treatment surface CAS may be adjacent to the first treatment surface LAS and may be directly connected thereto.

The second treatment surface CAS may correspond to the whole thickness direction (the Z-axis direction of FIG. 10) of the substrate 201.

According to some example embodiments, the second treatment surface CAS may be formed to correspond to one or more insulating layers 220 formed on the substrate 201. For example, the second treatment surface CAS may extend to side surfaces of the substrate 201 and side surfaces of the second treatment surface CAS.

According to some example embodiments, the insulating layers 220 may include a plurality of layers, for example, inorganic layers or organic layers selectively.

In addition, in a modified embodiment, as shown in FIG. 11, the second treatment surface CAS may be formed to correspond to at least one area of one or more conductive layers 225 formed on the substrate 201.

In addition, in an alternative embodiment, these conductive layers 225 may be covered by the insulating layers 220, and the second treatment surface CAS may be formed to correspond to the conductive layers 225 and the insulating layers 220.

The second treatment surface CAS may be an area treated using various methods and may include a polished area, for example. According to some example embodiments, the second treatment surface CAS may include a polished area processed with respect to the substrate 201 using a polishing member.

According to some example embodiments, the second treatment surface CAS may include a polished area processed with respect to the substrate 201 using a CNC polishing process.

Also, according to some example embodiments, the second treatment surface CAS may be an area on which a treatment process with respect to the cross-section of a cutting area is performed.

According to some example embodiments, the second treatment surface CAS may include regular or irregular patterns, for example, linear patterns. According to some example embodiments, the second treatment surface CAS may include linear patterns formed along a direction that crosses the thickness direction (the Z-axis direction of FIG. 10) of the substrate 201.

According to some example embodiments, the second treatment area CA may include the second treatment surface CAS, and the second treatment surface CAS may include a center treatment surface CAS1 and a first connection treatment surface CAS2.

The first center treatment surface CAS1 may be formed closer to a center axis than the first connection treatment surface CAS2 based on the thickness direction of the substrate 201. In an alternative embodiment, the first center treatment surface CAS1 may overlap the center axis based on the thickness direction of the substrate 201.

The first connection treatment surface CAS2 may be formed closer to the top surface of the substrate 201 (i.e., a surface on which the display portion 210 is formed) among surfaces of the substrate 201, than the center treatment surface CAS1. For example, the first connection treatment surface CAS2 may be connected to the top surface of the substrate 201 and may be between the top surface of the substrate 201 and the center treatment surface CAS1.

An angle formed between the center treatment surface CAS1 and the top surface of the substrate 201, and an angle formed between the first connection treatment surface CAS2 and the top surface of the substrate 201 may be different from each other. For example, an angle formed between the top surface of the substrate 201 and an extension line of the center treatment surface CAS1 may be about 90 degrees, and an angle formed between the top surface of the substrate 201 and the first connection treatment surface CAS2 may be greater than 90 degrees, according to some example embodiments, may be between 110 and 170 degrees.

For example, the first connection treatment surface CAS2 may include an inclined surface inclined with respect to the top surface of the substrate 201.

According to some example embodiments, the first connection treatment surface CAS2 may also include a curved surface.

In addition, the first connection treatment surface CAS2 may correspond to one or more insulating layers 220 formed on the substrate 201. For example, the first connection treatment surface CAS2 may be adjacent to edges of the insulating layers 220, and according to some example embodiments, may be in parallel to one area of the edges of the insulating layers 220.

In addition, in a modified embodiment, as shown in FIG. 11, the first connection treatment surface CAS2 may be formed to correspond to at least one area of one or more conductive layers 225 formed on the substrate 201. In addition, as an alternative embodiment, these conductive layers 225 may be covered by the insulating layers 220, and the first connection treatment surface CAS2 may be formed to correspond to the conductive layers 225 and the insulating layers 220. In a specific example, the first connection treatment surface CAS2 may be in parallel to one of the edges of the insulating layers 220 and the conductive layers 225.

According to some example embodiments, the second treatment surface CAS may include a second connection treatment surface CAS3.

The second connection treatment surface CAS3 may be formed closer to the bottom surface of the substrate 201 (i.e., an opposite surface to the top surface) among surfaces of the substrate 201 on which the display portion 210 is formed, than the center treatment surface CAS1. For example, the second connection treatment surface CAS3 may be connected to the bottom surface of the substrate 201 and may be formed between the bottom surface of the substrate 201 and the center treatment surface CAS1.

An angle formed between the center treatment surface CAS1 and the bottom surface of the substrate 201 and an angle formed between the second connection treatment surface CAS3 and the bottom surface of the substrate 201 may be different from each other. For example, an angle formed between the bottom surface of the substrate 201 and the extension line of the center treatment surface CAS1 may be about 90 degrees, and an angle formed between the bottom surface of the substrate 201 and the second connection treatment surface CAS3 may be greater than 90 degrees, according to some example embodiments, an angle between 110 and 170 degrees.

For example, the second connection treatment surface CAS3 may include an inclined surface inclined with respect to the bottom surface of the substrate 201.

According to some example embodiments, the second connection treatment surface CAS3 may include a curved surface.

The display apparatus according to some example embodiments may include a substrate, a display portion, a first treatment area, and a second treatment area. Each of the first treatment area and the second treatment area may correspond to at least one side surface of the substrate and may include the first treatment area and the second treatment area.

In addition, the first treatment surface and the second treatment surface may have different shapes and may include surfaces formed using different treatment methods, for example. Thus, when various members are positioned in an area adjacent to side surfaces of the substrate of the display apparatus, the first treatment surface and the second treatment surface may be formed according to characteristics of members to be positioned so that a precise design in the area adjacent to the side surfaces of the substrate may be easily realized, manufacturing and inspection of the display apparatus may be easily performed, and a display quality may be improved.

In addition, according to some example embodiments, the first treatment surface may include a laser-treated area, and smooth cutting using laser may be performed on the second treatment surface by including the polished area, and a precise end of a certain place may be easily performed through polishing.

In addition, according to some example embodiments, laser cutting may be performed on one side surface of the substrate overall, and polishing may be performed on a certain portion of the substrate so that, for example, after the first treatment surface is formed on the whole one side surface of the substrate, polishing may be performed to convert a part of the first treatment surface into a second treatment surface.

Thus, the display apparatus including the first treatment surface and the second treatment surface may be easily formed.

Also, in this case, insulating layers or conductive layers may be formed to be adjacent to the first treatment surface and the second treatment surface. Thus, product maturity at ends of a display, for example, a cutting area of the display, may be improved.

Also, according to some example embodiments, the first treatment surface of the first treatment area may include an insulating layer, and the second treatment surface of the second treatment area may include a conductive layer. Thus, treatment of the first treatment surface in the first treatment area, for example, a laser process is performed on the insulating layer so that the efficiency of cutting may be improved. Also, according to some example embodiments, when a metal layer is excluded from the first treatment surface, the efficiency of cutting with respect to a metal layer having low transmittance may be prevented from being lowered or may reduce the lowered cutting efficiency.

Meanwhile, a polishing process may be performed when the second treatment surface of the second treatment area including an insulating layer and a conductive layer, or at least one conductive layer is treated, so that certain remaining portions and protrusions at side surfaces of a substrate and an end of the conductive layer may be reduced or removed and thus uniformity characteristics at edges of the display apparatus may be improved.

According to some example embodiments, the first treatment surface may be first formed as the entire treatment of the edges of the substrate and then, the second treatment surface may be partially formed. When the first treatment surface is formed, abnormal remaining portions, for example, remaining portions of the conductive layer, may be precisely polished using a polishing process, for example, a CNC polishing process so that the overall precise appearance line characteristics at the side surfaces of the substrate may be improved.

Figure 12:
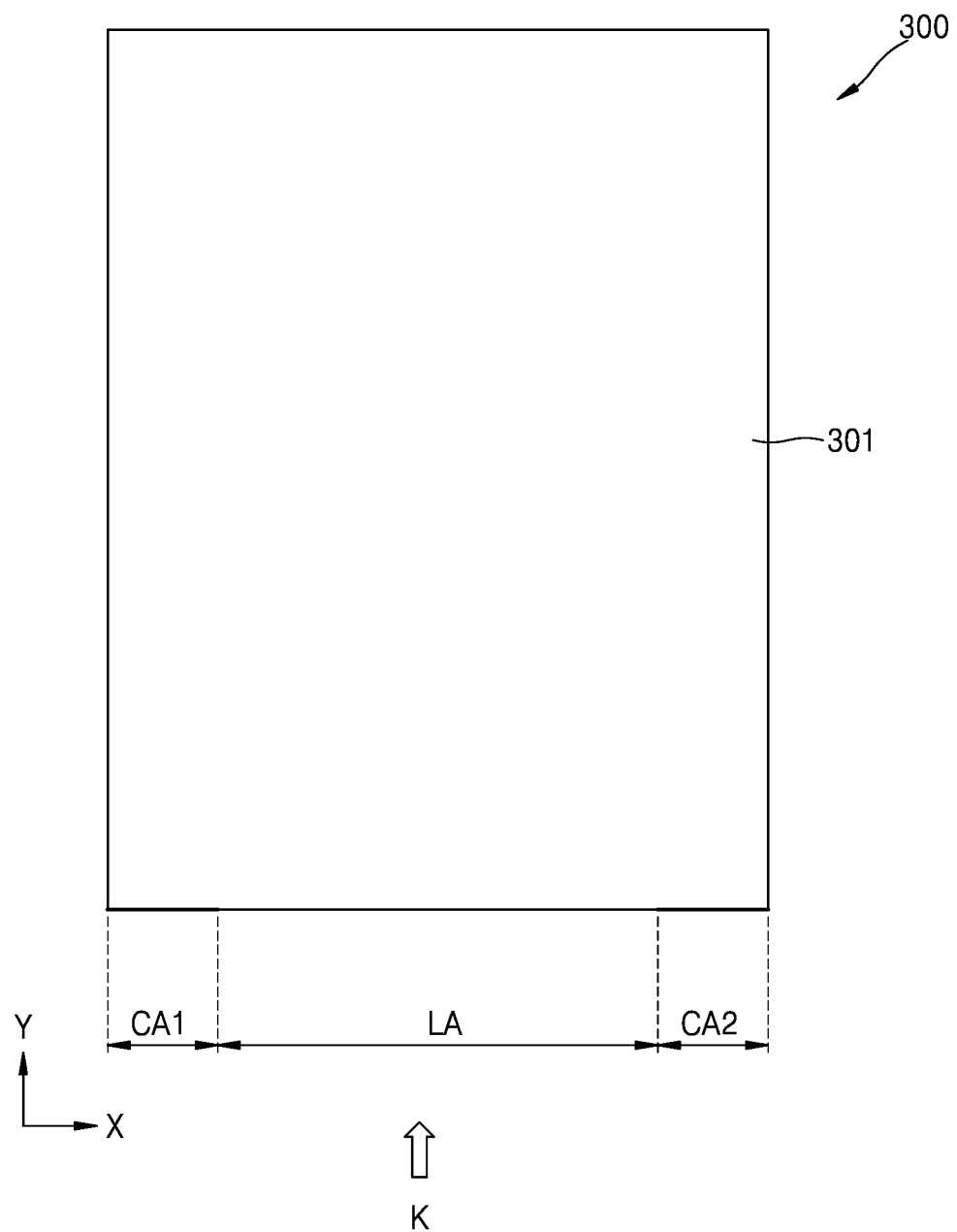
FIG. 12 is a plan view illustrating a display apparatus according to some example embodiments.
Figure 13:
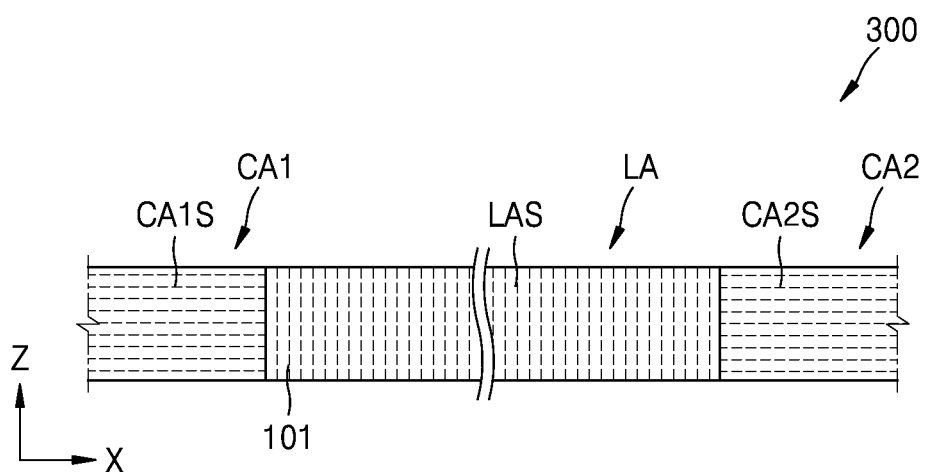
FIG. 13 is a view from a region K of FIG. 12.

FIG. 12 is a plan view illustrating a display apparatus according to some example embodiments, and FIG. 13 is a view from a region K of FIG. 12.

Referring to FIGS. 12 and 13, a display apparatus 300 may include a substrate 301, a display portion, a first treatment area LA, and second treatment areas CA1 and CA2.

A description of the substrate 301 and the display portion may be the same as or modified in a similar way to that of the above-described embodiment, and thus a detailed description thereof is omitted.

The first treatment area LA and the second treatment areas CA1 and CA2 may correspond to at least one side surface of the substrate 301.

For example, a surface of the substrate 301, on which a display portion is formed, is referred to as a "top surface" and an opposite surface thereto is referred to as a "bottom surface", and surfaces between the "top surface" and the "bottom surface" may be "side surfaces".

According to some example embodiments, the first treatment area LA and the second treatment areas CA1 and CA2 may be positioned at one side surface of the substrate 301.

The two, second treatment areas CA1 and CA2 may be spaced apart from each other by a distance (e.g., a predetermined distance), and each of the two second treatment areas CA1 and CA2 may be positioned adjacent to the first treatment area LA so as to be connected to the first treatment area LA.

In addition, the first treatment area LA may be between the two second treatment areas CA1 and CA2.

According to some example embodiments, the first treatment area LA and the second treatment areas CA1 and CA2 may be formed to correspond to the whole one side surface of the substrate 301.

The first treatment area LA and the second treatment areas CA1 and CA2 may have lengths, for example, lengths based on a lengthwise direction of one side surface of the substrate 301 (the X-axis direction of FIG. 12).

According to some example embodiments, the length of the first treatment area LA may be greater than the length of the second treatment area CA1 and the length of the second treatment area CA2.

According to some example embodiments, the length of the first treatment area LA may be greater than the sum of the lengths of the second treatment areas CA1 and CA2.

The first treatment area LA may include a first treatment surface LAS. A detailed description of the first treatment surface LAS may be the same as one of the above-described embodiments and modified embodiments or may be modified in a similar way to the above-described embodiments and modified embodiments and thus, a detailed description thereof is omitted.

The second treatment area CA1 may include a second treatment surface CA1S. The second treatment area CA2 may include a second treatment surface CA2S.

The second treatment surface CA1S and the second treatment surface CA2S may be adjacent to the first treatment surface LAS and directly connected thereto.

The second treatment surface CA1S and the second treatment surface CA2S may correspond to the whole thickness direction (the Z-axis direction of FIG. 13) of the substrate 301.

A detailed description of the second treatment surface CA1S and the second treatment surface CA2S may be the same as one of the above-described embodiments and modified embodiments or may be modified in a similar way to the above-described embodiments and modified embodiments, and thus a detailed description thereof is omitted.

The display apparatus according to one or more embodiments may include a substrate, a display portion, a first treatment area, and a second treatment area. Each of the first treatment area and the second treatment area may correspond to at least one side surface of the substrate and may include a first treatment surface and a second treatment surface.

In addition, a plurality of second treatment areas may be spaced apart from one another by a predetermined distance. Thus, the first treatment area and the second treatment area may correspond to one side surface of the substrate and may be formed at certain positions in various ways so that the first treatment area and the second treatment area may be precisely positioned according to positions of various members of the substrate, for example, a position of an insulating layer or conductive layer.

Figure 14:
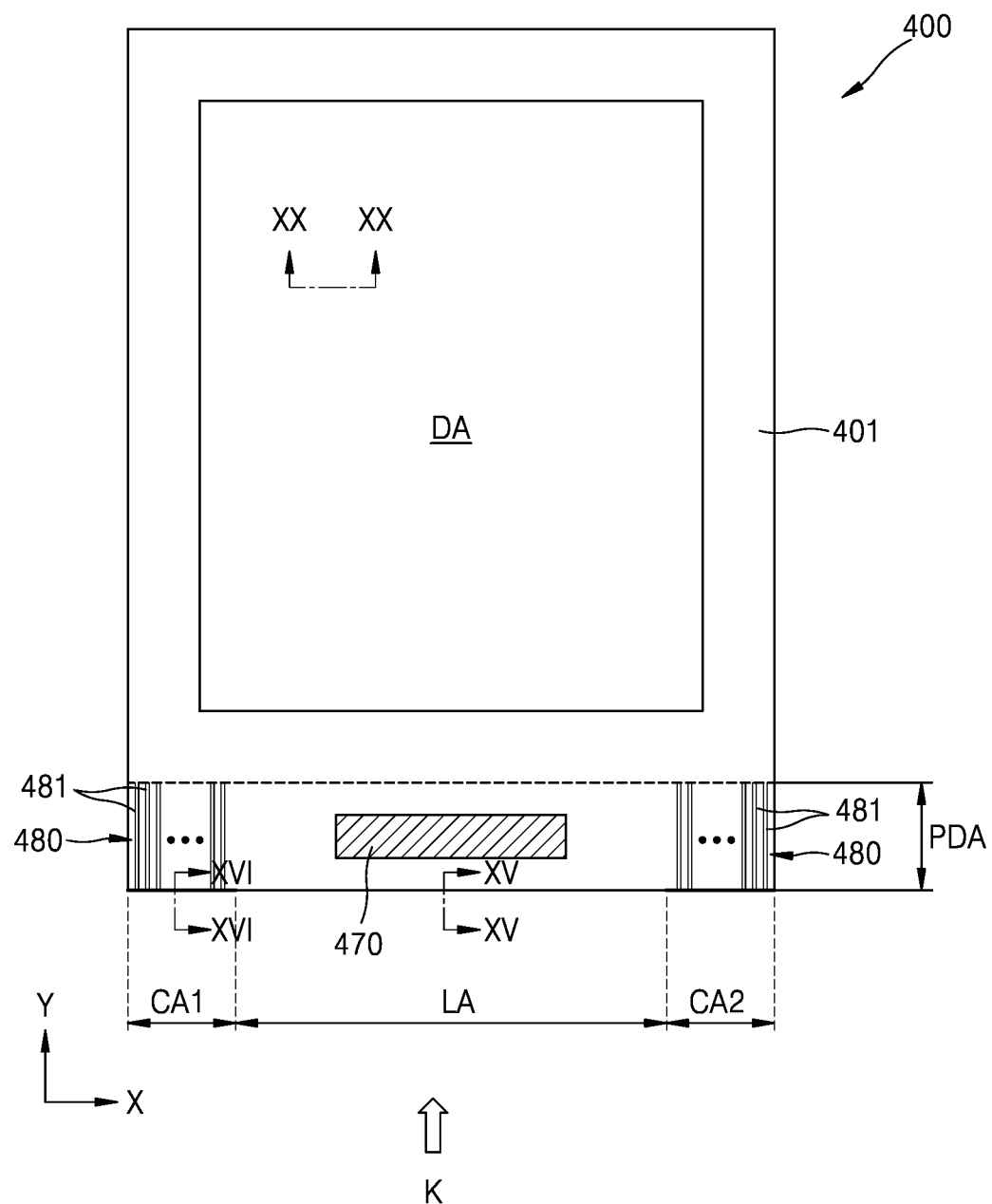
FIG. 14 is a plan view illustrating a display apparatus according to some example embodiments.
Figure 15:
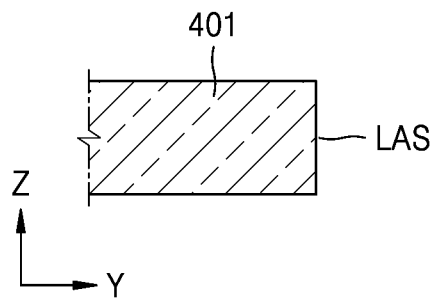
FIG. 15 is a cross-sectional view taken along a line XV-XV of FIG. 14.
Figure 16:
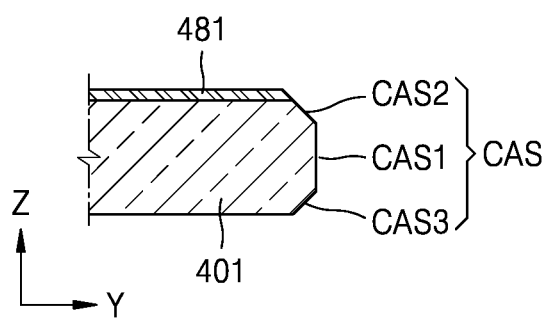
FIG. 16 is a cross-sectional view taken along a line XVI-XVI of FIG. 14.

FIG. 14 is a plan view illustrating a display apparatus according to some example embodiments, FIG. 15 is a cross-sectional view taken along a line XV-XV of FIG. 14, and FIG. 16 is a cross-sectional view taken along a line XVI-XVI of FIG. 14.

Figure 17:
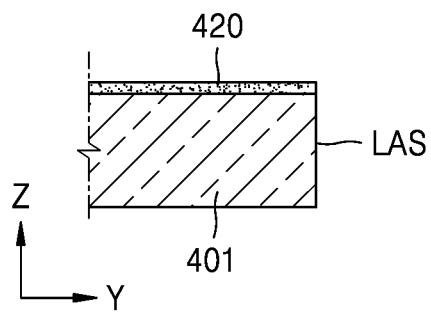
FIG. 17 is a view illustrating a modified embodiment of FIG. 15.
Figure 18:
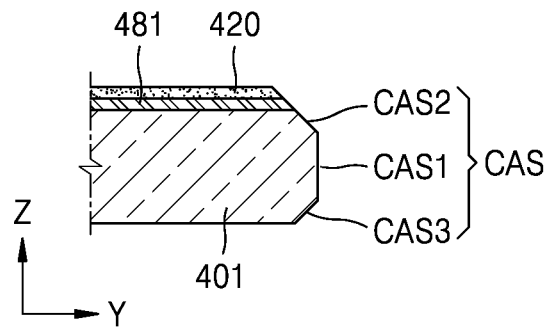
FIG. 18 is a view illustrating a modified embodiment of FIG. 16.

FIG. 17 is a view illustrating a modified embodiment of FIG. 15, and FIG. 18 is a view illustrating a modified embodiment of FIG. 16.

Figure 19:
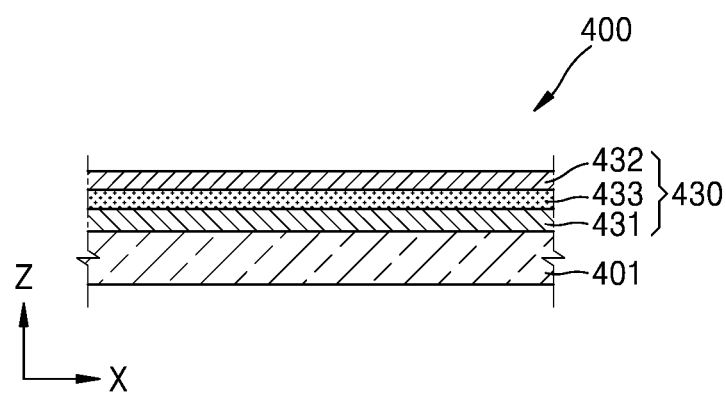
FIG. 19 is a cross-sectional view taken along a line XX-XX of FIG. 14.

FIG. 19 is a cross-sectional view taken along a line XX-XX of FIG. 14.

FIGS. 20 through 23 are views illustrating a modified embodiment of FIG. 19.

Referring to FIGS. 14 through 19, a display apparatus 400 may include a substrate 401, a display portion, a first treatment area LA, and second treatment areas CA1 and CA2.

The substrate 401 may be formed using various transparent or opaque materials.

According to some example embodiments, the substrate 401 may be formed of glass, metal, or other organic materials.

In addition, according to some example embodiments, the substrate 401 may be flexible, bendable, foldable, or rollable materials.

In addition, according to some example embodiments, flexible materials for forming the substrate 401 may include thin glass, metal, or plastics.

According to some example embodiments, the substrate 401 may include polyimide (PI), and according to some example embodiments, the substrate 401 may include different plastic materials.

A display area DA may be defined on the substrate 401. A display portion may be positioned in the display area DA, and the display portion may include at least a display device, for example, an OLED.

A peripheral area PDA may be defined on the substrate 401. The peripheral area PDA may not overlap the display area DA. The peripheral area PDA may be a non-display area, and in an alternative embodiment, the peripheral area PDA may include an area in which one or more pad portions 470 are positioned.

The pad portion 470 may be electrically connected to at least one area of the display area DA.

The peripheral area PDA may include edges of one side surface of the substrate 401.

One or more wiring portions 480 may be formed in the peripheral area PDA. The wiring portion 480 may include one or more wiring members 481, for example, a plurality of wiring members 481.

According to some example embodiments, a plurality of wiring portions 480 may be positioned in the peripheral area PDA, for example, at both sides of the pad portion 470 between two wiring portions 480, as shown in FIG. 14.

At least one wiring member 481 of the wiring portion 480 may be electrically connected to one area of the display area DA.

A display portion may be positioned in the display area DA. The display portion may include one or more display devices 430, for example, an OLED. A detailed description thereof will be provided later with reference to FIGS. 19 through 23.

The first treatment area LA and the second treatment areas CA1 and CA2 may correspond to at least one side surface of the substrate 401.

For example, when a surface of the substrate 401, on which a display portion is formed, is referred to as a "top surface" and an opposite surface thereto is referred to as a "bottom surface", surfaces between the "top surface" and the "bottom surface" may be referred to as "side surfaces".

According to some example embodiments, the first treatment area LA and the second treatment areas CA1 and CA2 may be positioned at one side surface of the substrate 401.

Also, for example, the first treatment area LA and the second treatment areas CA1 and CA2 may be formed in the peripheral area PDA. In a specific example, the first treatment area LA and the second treatment areas CA1 and CA2 may be positioned at side surfaces of an edge including the peripheral area PDA among edges of the substrate 401.

Two, second treatment areas CA1 and CA2 may be spaced apart from each other by a distance (e.g., a predetermined distance), and each of the two second treatment areas CA1 and CA2 may be positioned adjacent to the first treatment area LA so as to be connected to the first treatment area LA.

Also, the first treatment area LA may be between the two second treatment areas CA1 and CA2.

According to some example embodiments, the first treatment area LA and the second treatment areas CA1 and CA2 may be formed to correspond to the whole one side surface of the substrate 401.

The first treatment area LA and the second treatment areas CA1 and CA2 may have lengths, for example, lengths based on a lengthwise direction of one side surface of the substrate 401 (the X-axis direction of FIG. 14).

According to some example embodiments, the length of the first treatment area LA may be greater than the length of the second treatment area CA1 and the length of the second treatment area CA2.

According to some example embodiments, the length of the first treatment area LA may be greater than the sum of the lengths of the second treatment area CA1 and the second treatment area CA2.

Each of the second treatment areas CA1 and CA2 may correspond to the wiring portion 480, for example, wiring members 481 of the wiring portion 480.

According to some example embodiments, all of the wiring members 841 of the wiring portion 480 may correspond to each of the second treatment areas CA1 and CA2.

For example, all of the wiring members 481 of the wiring portion 480 may be connected to each of the second treatment areas CA1 and CA2, specifically, the second treatment surface CAS.

The first treatment area LA may include the first treatment surface LAS. The first treatment surface LAS may correspond to the whole thickness direction (the Z-axis direction of FIG. 15) of the substrate 401.

The first treatment surface LAS may be an area treated using various methods and may include a laser-processed area, for example. According to some example embodiments, the first treatment surface LAS may include a laser-cutting area with respect to the substrate 401 and may include a cutting cross-section during laser cutting.

According to some example embodiments, the first treatment surface LAS may include regular or irregular patterns and linear patterns, for example. According to some example embodiments, the first treatment surface LAS may include linear patterns formed along the thickness direction (the Z-axis direction of FIG. 15) of the substrate 401.

FIG. 17 illustrates a modified embodiment of FIG. 15. As shown in FIG. 17, according to some example embodiments, the first treatment surface LAS may correspond to one or more insulating layers 420 formed on the substrate 401. For example, the first treatment surface LAS may extend to side surfaces of the substrate 401 and side surfaces of the insulating layers 420.

According to some example embodiments, the insulating layers 420 may include a plurality of layers, for example, inorganic layers or organic layers.

According to some example embodiments, the first treatment surface LAS may correspond to at least one area of one or more conductive layers formed on the substrate 401.

Each of the second treatment areas CA1 and CA2 may include a second treatment surface CAS. The second treatment surface CAS may be adjacent to the first treatment surface LAS and may be directly connected thereto.

The second treatment surface CAS may correspond to the whole thickness direction (the Z-axis direction of FIG. 14) of the substrate 401.

Referring to FIG. 16, the second treatment surface CAS may include a center treatment surface CAS1 and a first connection treatment surface CAS2. In addition, according to some example embodiments, the second treatment surface CAS may include a second connection treatment surface CAS3.

A description of the center treatment surface CAS1, the first connection treatment surface CAS2, and the second connection treatment surface CAS3 may be the same as or may be modified in a similar way to that of the above description as occasions demand and thus, a detailed description thereof is omitted.

The second treatment surface CAS may correspond to one or more conductive layers formed on the substrate 401, for example, a wiring member 481 of a wiring portion 480. In a specific example, the first connection treatment surface CAS2 of the second treatment surface CAS may be connected to an end of the wiring member 481.

According to some example embodiments, a boundary line of the first connection treatment surface CAS2 of the second treatment surface CAS may be connected to a boundary line of the wiring member 481, for example, in parallel thereto.

Thus, the wiring member 481 may be prevented from protruding from edges of the substrate 401 or from unwanted remaining, or the protrusion or remaining may be reduced so that manufacturing features and electrical characteristics of the display apparatus 400 may be improved and picture quality may be improved.

According to some example embodiments, as shown in FIG. 18, an insulating layer 420 may be formed on the wiring member 481, and the second treatment surface CAS may correspond to the wiring member 481 and the insulating layer 420.

For example, the first connection treatment surface CAS2 of the second treatment surface CAS may be connected to the wiring member 481 and an end of the insulating layer 420.

According to some example embodiments, a boundary line of the first connection treatment surface CAS2 of the second treatment surface CAS may be connected to a boundary line of the wiring member 481 and the insulating layer 420 and for example, in parallel thereto.

The second treatment surface CAS of the second treatment area CA may correspond to the whole thickness direction (the Z-axis direction of FIG. 16) of the substrate 401.

The second treatment surface CAS may be an area treated using various methods and may include a polished area, for example. According to some example embodiments, the second treatment surface CAS may include a polished area processed with respect to the substrate 401 using a polishing member.

According to some example embodiments, the second treatment surface CAS may include a polished area processed with respect to the substrate 401 using a CNC process.

Also, according to some example embodiments, a treatment process with respect to the cross-section of the cutting area may be performed on the second treatment surface CAS.

According to some example embodiments, the second treatment surface CAS may include regular or irregular patterns, for example, linear patterns. According to some example embodiments, the second treatment surface CAS may include linear patterns formed along a direction that crosses the thickness direction (the Z-axis direction of FIG. 16) of the substrate 401.

A display portion will be described with reference to FIGS. 19 through 23.

FIG. 19 is a cross-sectional view taken along a line XX-XX of FIG. 14.

Referring to FIG. 19, a display device 430 is formed on the substrate 401. The display device 430 may be an OLED, for example, and may include a first electrode 431, a second electrode 432, and an intermediate layer 433.

The first electrode 431 may function as an anode, and the second electrode 432 may function as a cathode. Of course, the order of these polarities may be opposite to this.

The first electrode 431 may include indium tin oxide (ITO), indium zinc oxide (IZO), zinc oxide (ZnO) or $In_2O_3$. Also, according to the purpose and design conditions, the first electrode 431 may include a reflective layer formed of silver (Ag), magnesium (Mg), aluminum (Al), platinum (Pt), palladium (Pd), gold (Au), nickel (Ni), neodymium (Nd), iridium (Ir), chromium (Cr), lithium (Li), ytterbium (Yb) or calcium (Ca).

The intermediate layer 433 may include an organic emission layer that emits visible rays. Also, the intermediate layer 433 may include at least one of a hole injection layer (HIL), a hole transport layer (HTL), an electron transport layer (ETL), and an electron injection layer (EIL) selectively.

The second electrode 432 may be formed using metal, such as Ag, Mg, Al, Pt, Pd, Au, Ni, Nd, Ir, Cr, Li, or Ca.

In addition, according to some example embodiments, the second electrode 432 may include ITO, IZO, ZnO, or $In_2O_3$ through which light may pass.

When a voltage is applied to the intermediate layer 433 through the first electrode 431 and the second electrode 432, the organic emission layer of the intermediate layer 433 emits visible rays so that an image may be realized.

FIGS. 20 through 23 are views illustrating a modified embodiment of FIG. 19.

Figure 20:
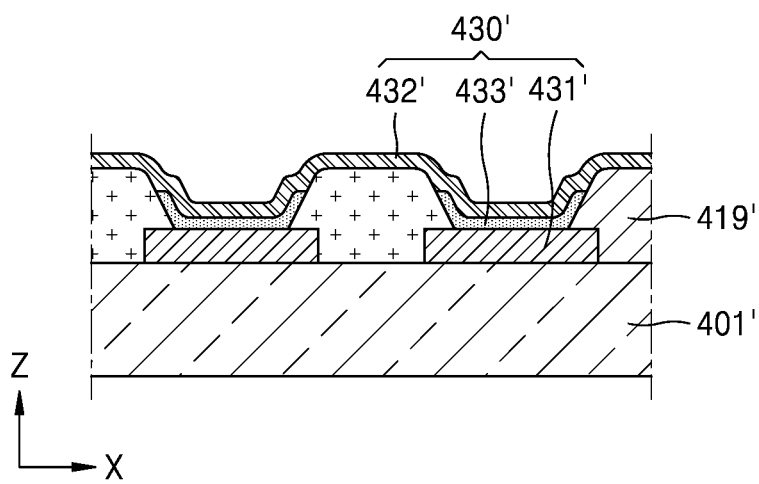
FIGS. 20 through 23 are views illustrating a modified embodiment of FIG. 19.

First, referring to FIG. 20, a display device 430' is formed on a substrate 401'. The display device 430' that is an OLED, for example, includes a first electrode 431', a second electrode 432', and an intermediate layer 433'.

The first electrode 131' is formed on the substrate 401'. A pixel-defining layer 419' is formed on the first electrode 131' so as to expose a region (e.g., a predetermined region) of the first electrode 131'.

The pixel-defining layer 419' may be formed using various materials. As an example, the pixel-defining layer 419' may include organic materials, and according to some example embodiments, may include inorganic materials.

According to some example embodiments, the pixel-defining layer 419' may include PI-based materials or acryl-based materials.

The intermediate layer 433' may be formed in a region of the first electrode 431', which is not covered by the pixel-defining layer 419' but is exposed.

The second electrode 432' may be formed on the intermediate layer 433', and according to some example embodiments, the second electrode 432' may be commonly formed on the entire pixel.

Figure 21:
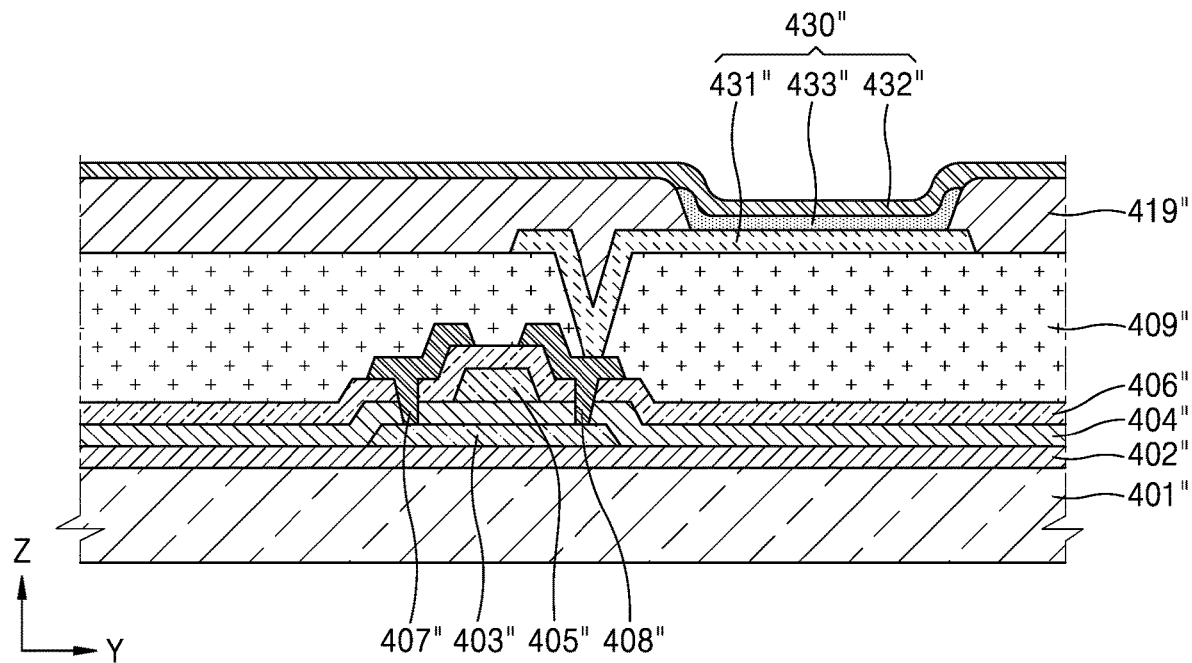

According to some example embodiments, referring to FIG. 21, a display device 430" and a thin-film transistor (TFT) are formed on the substrate 401". The display device 430" may be an OLED, for example, and may include a first electrode 431", a second electrode 432", and an intermediate layer 433".

The TFT may include an active layer 403", a gate electrode 405", a source electrode 407", and a drain electrode 408".

The active layer 403" is formed on the substrate 401". According to some example embodiments, a buffer layer 402" may be formed between the substrate 401" and the active layer 403".

The active layer 403" may include an inorganic semiconductor material such as silicon, an organic semiconductor material, or an oxide semiconductor material, and may also be formed by injecting a p-type or n-type dopant.

A gate insulating layer 404" is formed on the active layer 403". The gate electrode 405" is formed on the gate insulating layer 404" so as to correspond to the active layer 403".

An interlayer insulating layer 406" is formed to cover the gate electrode 405", and the source electrode 407" and the drain electrode 408" are formed on the interlayer insulating layer 406" so as to be in contact with a predetermined region of the active layer 403".

A passivation layer 409" is formed to cover the source electrode 407" and the drain electrode 408". A top surface of the passivation layer 409" may be a flat surface in an alternative embodiment. In another example, a planarization layer may be further formed on the passivation layer 409".

A first electrode 431" is formed on the passivation layer 409". The first electrode 431" is electrically connected to one of the source electrode 407" and the drain electrode 408", and in FIG. 21, for convenience of explanation, the first electrode 431" is connected to the drain electrode 408".

The pixel-defining layer 419" is formed on the first electrode 431". The pixel-defining layer 419" does not cover at least a predetermined region of the top surface of the first electrode 431". An intermediate layer 433" is formed on the top surface of the first electrode 431" and includes an organic emission layer. A second electrode 432" is formed on the intermediate layer 433".

According to some example embodiments, an encapsulation portion is formed on the display device 430" so as to protect the display device 430".

Figure 22:
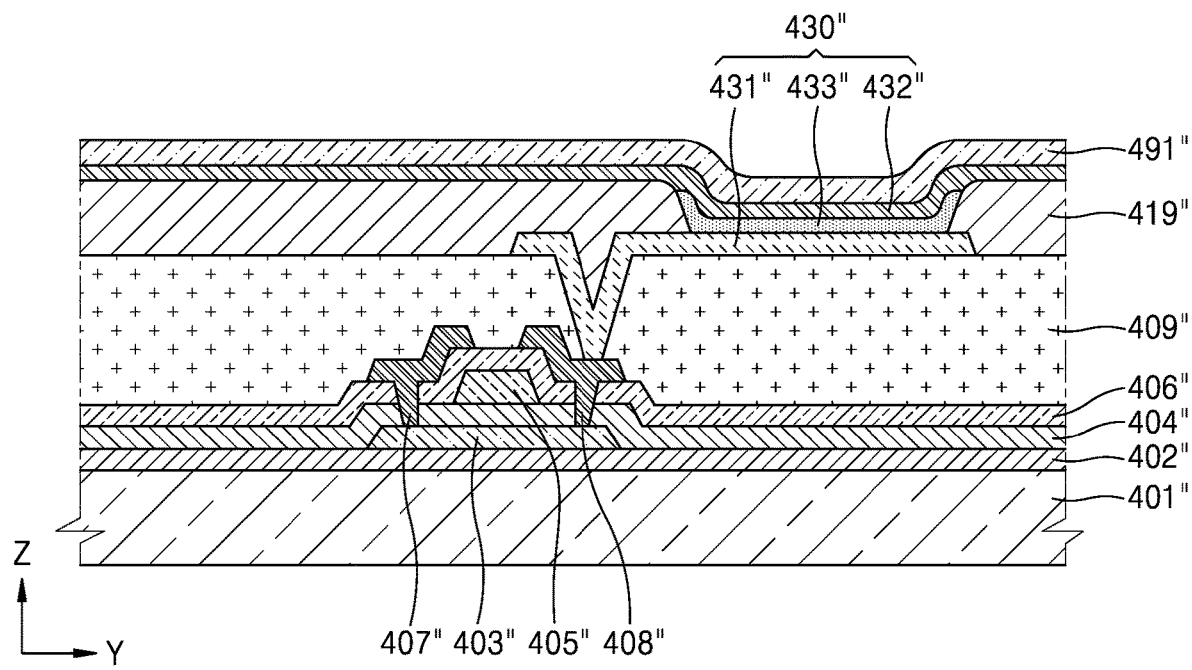

For example, as shown in FIG. 22, an encapsulation portion 491" may be formed on the second electrode 432". According to some example embodiments, the encapsulation portion 491" may have a thin-film shape and for example, may include one layer or a plurality of layers.

According to some example embodiments, the encapsulation portion 491" may include one or more layers including an inorganic material such as silicon oxide or silicon nitride, and one or more layers including an organic material such as epoxy and polyimide. In another example, the encapsulation portion 491" may include a structure in which a layer including an inorganic material and a layer including an organic material are alternately stacked.

Figure 23:
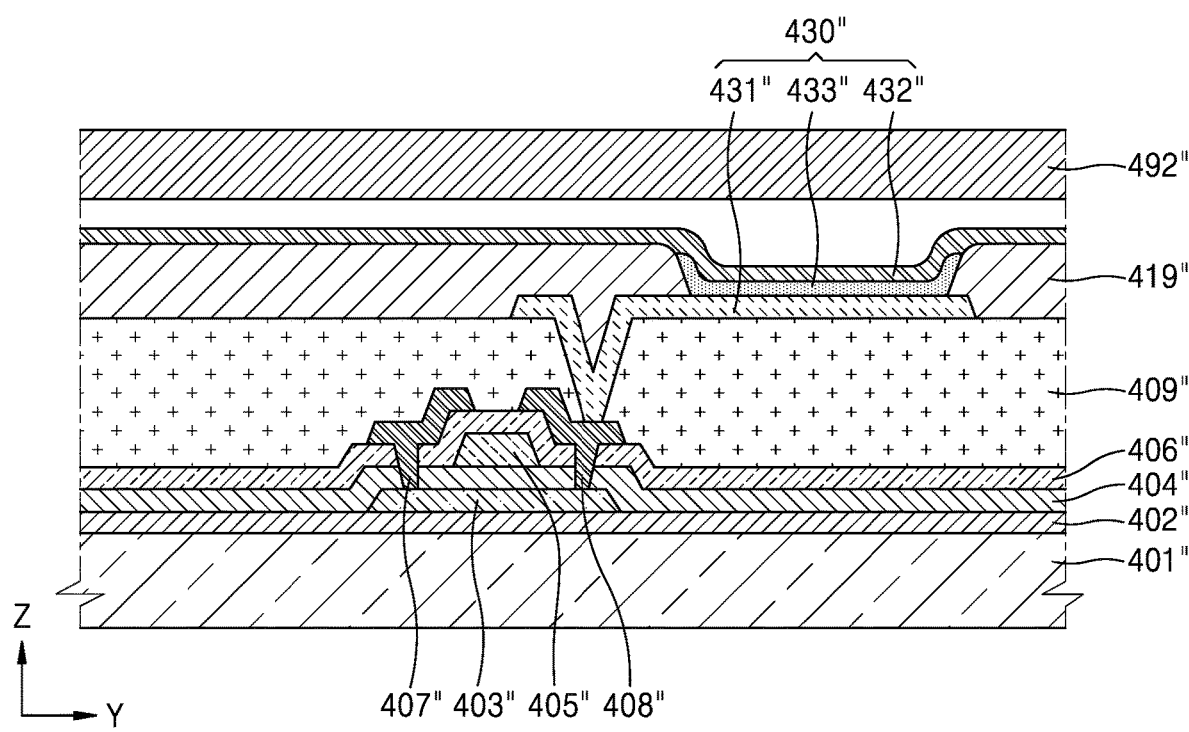

In addition, in another example, as shown in FIG. 23, the encapsulation portion 492" having a shape of a substrate may also be positioned on the second electrode 432".

The display apparatus according to some example embodiments may include a substrate, a display portion, a first treatment area, and a second treatment area. Each of the first treatment area and the second treatment area may correspond to at least one side surface of the substrate and may include a first treatment surface and a second treatment surface.

Also, the first treatment surface and the second treatment surface may have different shapes and may include surfaces formed using different treatment methods, for example. Thus, when various members are positioned in a region adjacent to side surfaces of the substrate of the display apparatus, according to characteristics of the members to be positioned, the first treatment surface and the second treatment surface may be formed so that a precise design of a region adjacent to the side surfaces of the substrate may be easily performed, manufacturing and inspection of the display apparatus may be easily performed and a display quality may be improved.

Also, according to some example embodiments, the first treatment surface may include a laser-processed area, and the second treatment surface may include a polished area so that smooth cutting using laser may be performed and precise ends of a certain place may be easily performed through polishing.

Also, according to some example embodiments, laser cutting may be performed on the whole one side surface of the substrate, and polishing may be performed on certain portions of the one side surface of the substrate, and for example, after the first treatment surface is formed on the whole one side surface of the substrate, polishing may be performed so that a part of the first treatment surface may be converted into the second treatment surface.

Thus, the display apparatus including the first treatment surface and the second treatment surface may be easily formed.

Also, in this case, an insulating layer or conductive layer may be formed to be adjacent to the first treatment surface and the second treatment surface. Thus, product quality at the edges, for example, the cutting area of the display may be improved.

Also, according to some example embodiments, the first treatment surface of the first treatment area may include an insulating layer, and the second treatment surface of the second treatment area may include a wiring member. Thus, treatment of the first treatment surface of the first treatment area, for example, a laser treatment process may be performed on the insulating layer so that the efficiency of cutting may be improved. Also, when the wiring member is excluded from the first treatment surface, the cutting efficiency of metal of the wiring member having weak transmittance may be prevented from being lowered during laser cutting, or the lowered cutting efficiency may be reduced.

Meanwhile, a polishing process may be performed when the second treatment surface of the second treatment area including an insulating layer and a wiring member, or at least the wiring member is performed, so that certain remaining portions and protrusions at the side surfaces of the substrate and the ends of the wiring member may be reduced or removed and uniformity characteristics of the edges of the display apparatus may be improved.

According to some example embodiments, after a first treatment surface is first formed as the entire treatment of the edges of the substrate, a second treatment surface may be partially formed. When the first treatment surface is formed, abnormal remaining portions, for example, remaining portions of the wiring member, may be precisely polished using a polishing process, for example, a CNC polishing process so that the overall precise appearance line characteristics at the side surfaces of the substrate may be improved.

Also, the first connection treatment surface of the second treatment surface may be connected to the wiring member, and the ends of the wiring member and the ends of the first connection treatment surface may be connected to each other. Thus, a certain region and the remaining region of the wiring member may be removed so that the ends of the wiring member may not exceed at least the edges of the substrate or may be inside the edges of the substrate so that certain electrical or physical defects may be reduced, precise edge characteristics of the display apparatus may be improved and electrical characteristics and picture quality characteristics may be improved.

Also, after the first treatment surface having high efficiency is formed, a second treatment surface with respect to the wiring portion including the wiring member may be formed so that costs of a process may be reduced.

Figure 24:
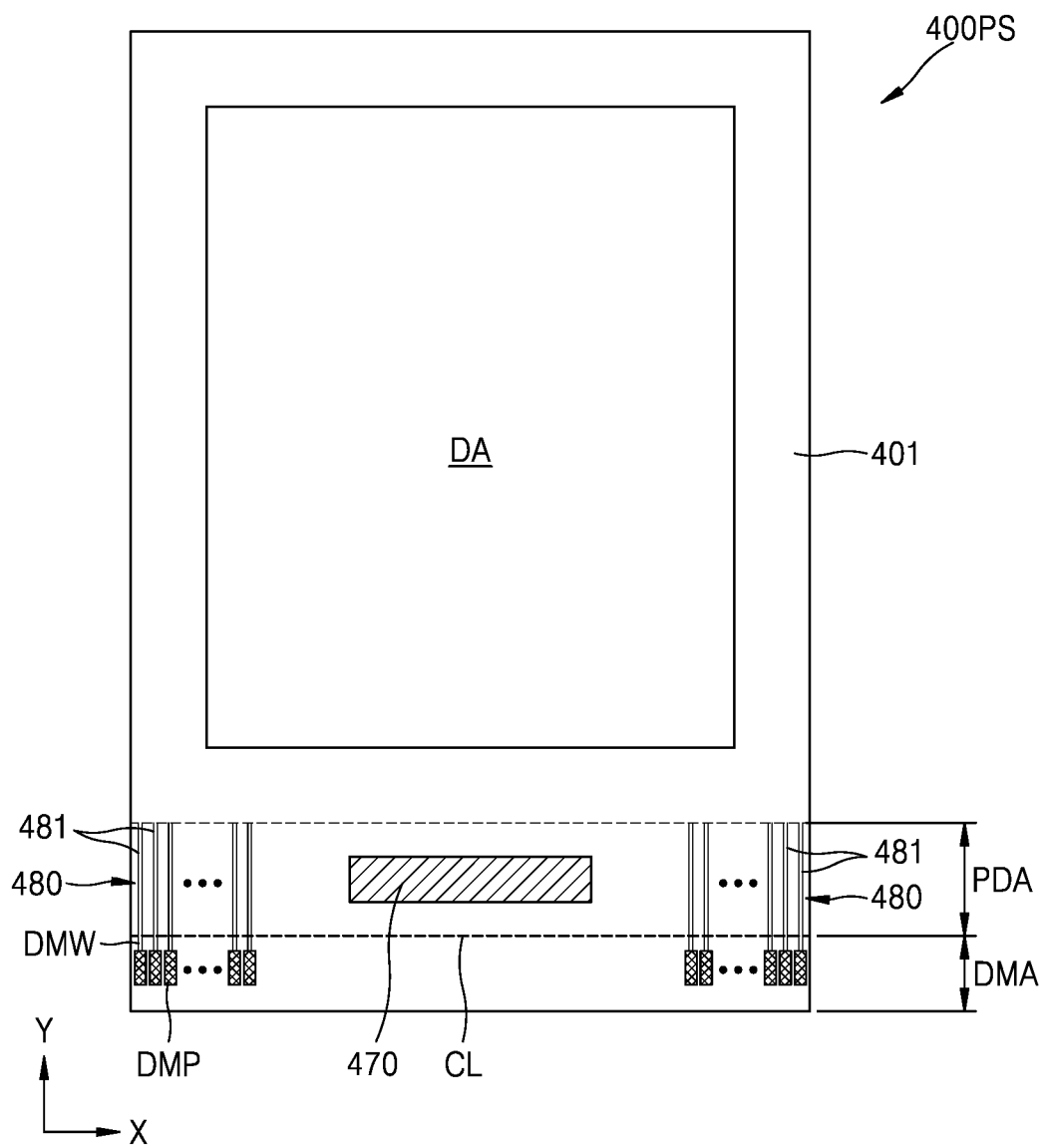
FIGS. 24 through 26 are views illustrating a method of manufacturing a display apparatus, according to some example embodiments.
Figure 25:
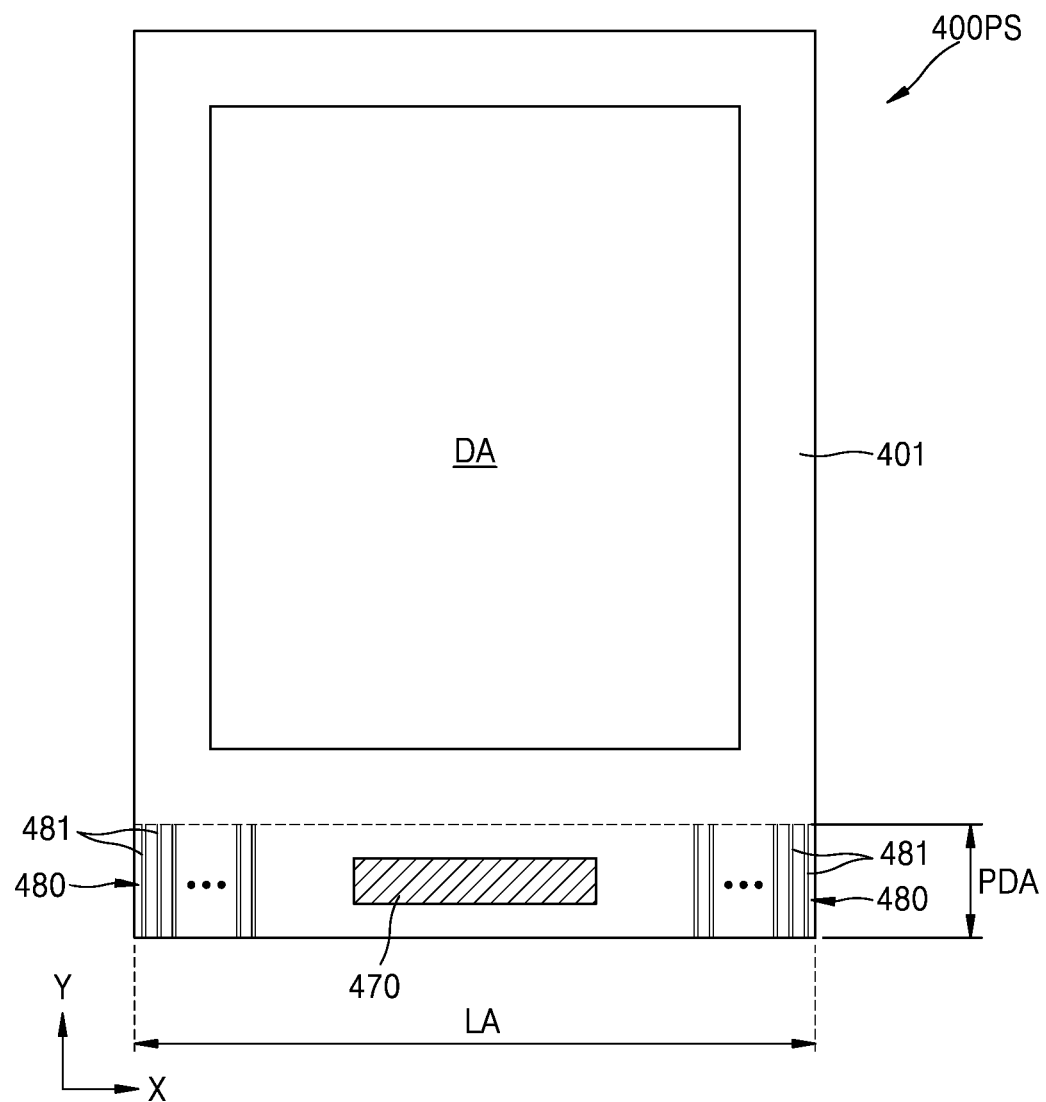
Figure 26:
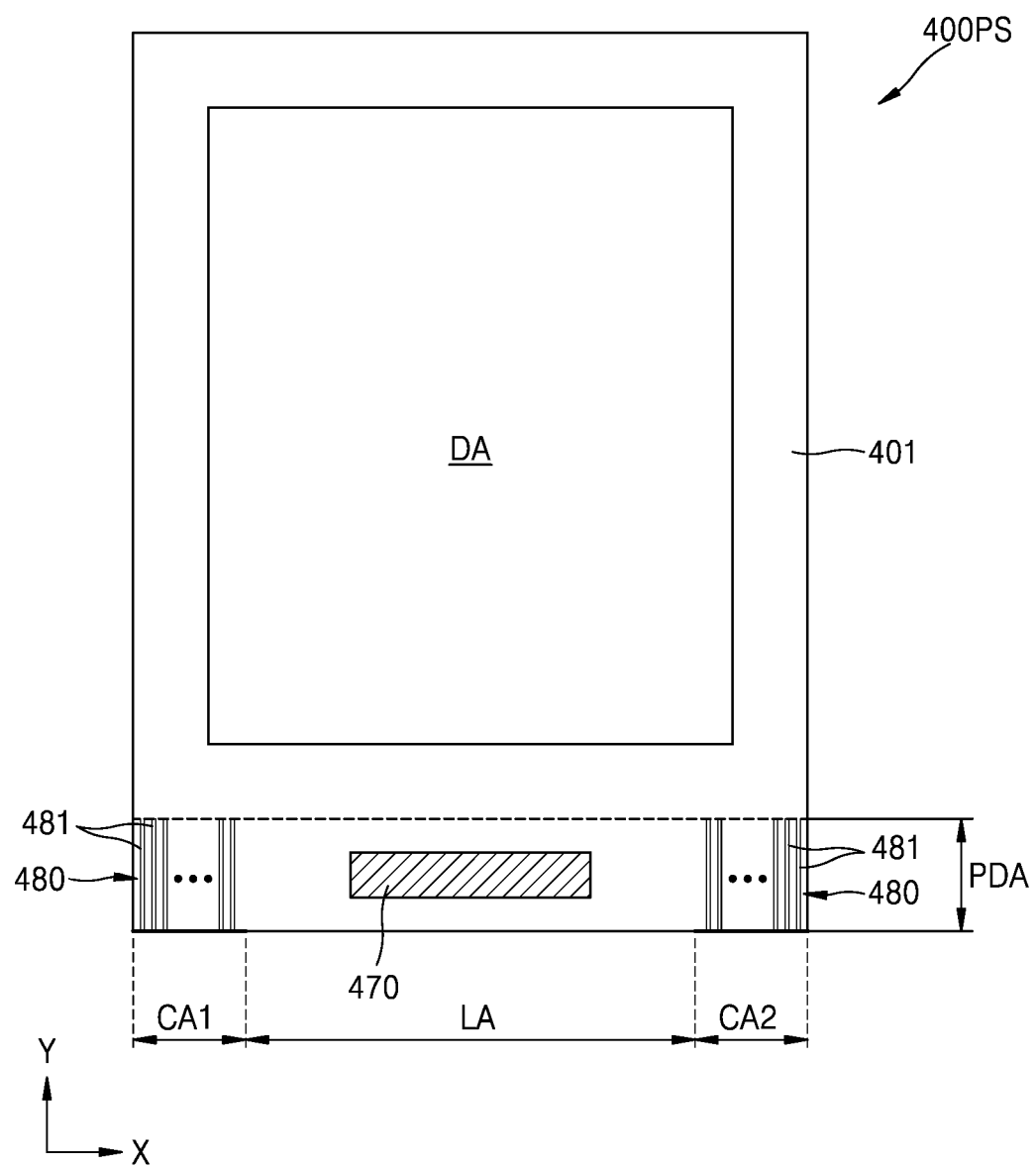

FIGS. 24 through 26 are views illustrating a method of manufacturing a display apparatus, according to some example embodiments.

For convenience of explanation, in the present embodiment, the display apparatus 400 of FIG. 14 described above will be described.

First, referring to FIG. 24, a display apparatus preparatory structure 400PS is shown.

In the display apparatus preparatory structure 400PS, a dummy area DMA may be formed on a substrate 401, and the dummy area DMA may be an area to be removed based on a cutting line CL.

One or more dummy pads DMP are formed in the dummy area DMA. The dummy pad DMP may be electrically connected to a wiring member 581, for example, via a connection member DMW.

Electrical signals for inspection may be applied to the display area DA using the dummy pad DMP. Thus, various electrical inspections including defect inspection of the display area DA may be performed.

After inspection is performed using the dummy pad DMP, the dummy area DMA may be removed based on the cutting line CL.

For example, as shown in FIG. 25, a first treatment area LA may be formed to correspond to the whole of the cutting line CL. For example, a cutting process may be performed along the cutting line CL by radiating laser onto the substrate 401.

Thus, the first treatment area LA may be formed in the whole of the cutting line CL of the substrate 401, and a first treatment surface may be formed at side surfaces of the substrate 401. For example, the first treatment area LA may be formed even in a region including ends of the wiring member 481.

Then, referring to FIG. 26, two second treatment areas (CA1, CA2) may be formed in the region including at least the wiring portion 480. For example, the second treatment areas (CA1, CA2) may be formed to correspond to the wiring member 481 of the wiring portion 480, and a second treatment surface may be formed in the region including the ends of the wiring member 481.

According to some example embodiments, a second treatment area (CA1 or CA2) may be formed in the region including at least the wiring portion 480.

Thus, the display apparatus 400 may be finally formed.

In the forming of the first treatment area LA, when laser is radiated onto the wiring member 481, transmittance of the wiring member 481 is not high. Thus, the efficiency of a cutting process of the wiring member 481 may be lower than the efficiency of a cutting process of the substrate 401 and an insulating layer, and the cutting quality of the cutting process of the wiring member 481 may be lower than the cutting quality of the cutting process of the substrate 401 and the insulating layer.

For example, certain residual materials may remain in edges of the wiring member 481, and less cut protrusions of the wiring member 481 may be irregularly protrude from the edges of the wiring member 481. Thus, it may not be easy to attain a wanted substrate 401 and wanted edges of the wiring member 481.

According to some example embodiments, a second treatment area CA may be performed in the region including the wiring portion 480 through a polishing process, in a specific example, through a CNC polishing process. Through this polishing process, the residual materials of the wiring member 481 and the protrusions from the edges of the wiring member 481 may be effectively polished, and according to some example embodiments, the wiring member 481 may be treated so as to be connected to the boundary line of the second treatment surface of the second treatment area CA.

Thus, electrical defects in the edges of the display apparatus, for example, in the edges including the wiring member, may be reduced so that electrical features and picture quality characteristics of the display apparatus may be improved.

Also, the first treatment area may be primarily formed entirely in one side surface of the substrate through laser treatment having high efficiency of a process and low costs and then, a required region may be selected, and polishing such as CNC polishing may be performed so that the efficiency of a process may be maintained, costs of the process may be reduced and manufacturing characteristics of the display apparatus may be improved.

Figure 27:
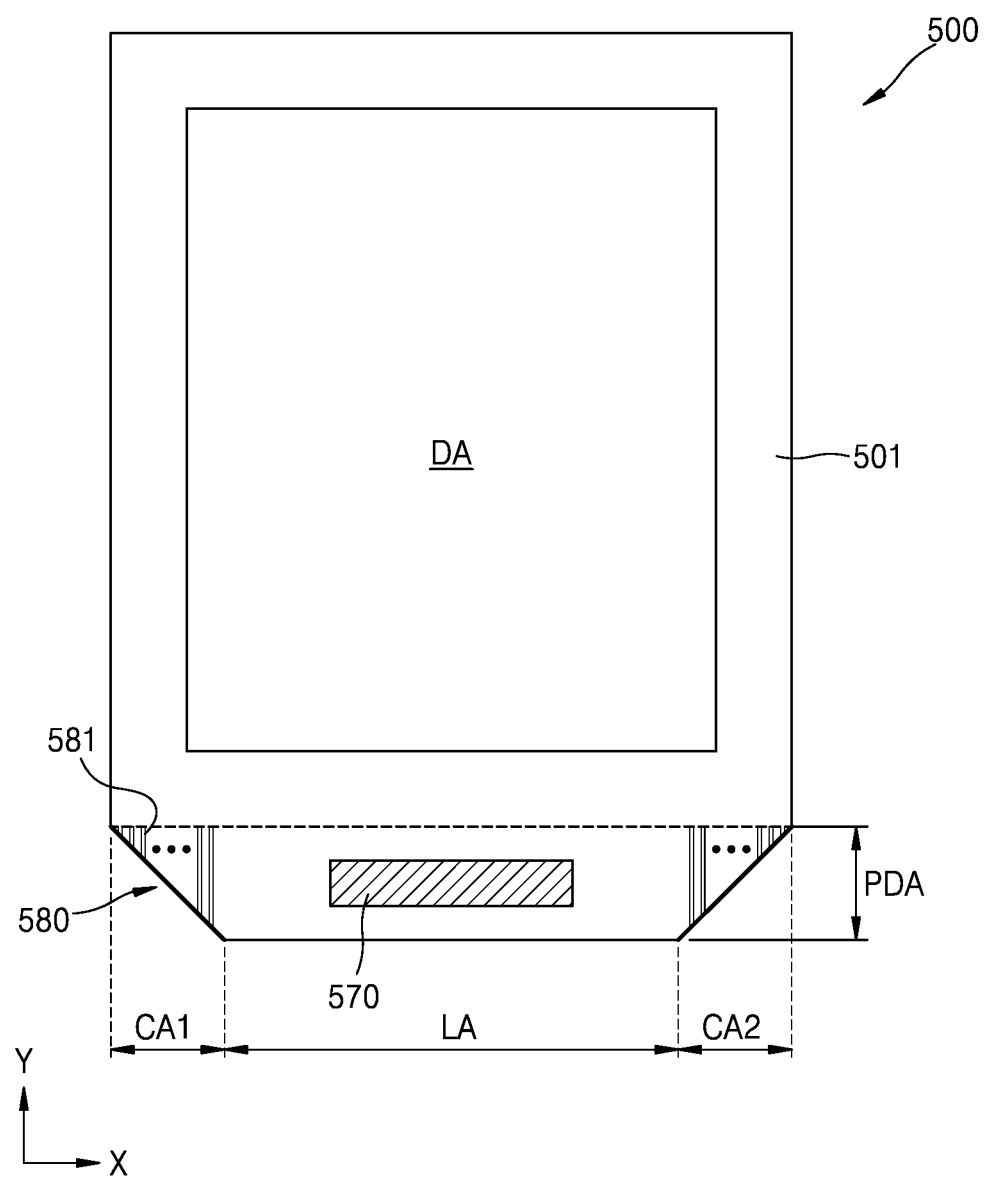
FIG. 27 is a plan view illustrating a display apparatus according to some example embodiments.

FIG. 27 is a plan view illustrating a display apparatus according to some example embodiments.

Referring to FIG. 27, a display apparatus 500 may include a substrate 501, a display portion, a first treatment area LA, and second treatment areas CA1 and CA2.

A display area DA may be defined in the substrate 501. The display portion may be positioned in the display area DA, and the display portion may include at least display device, for example, an OLED.

A peripheral area PDA may be defined on the substrate 501. The peripheral area PDA may not overlap the display area DA. The peripheral area PDA may be a non-display area, and according to some example embodiments, the peripheral area PDA may include a region in which one or more pad portions 570 are positioned.

The pad portion 570 may be electrically connected to at least one region of the display area DA.

The peripheral region PDA may include edges of one side surface of the substrate 501.

One or more wiring portions 580 may be formed in the peripheral area PDA, and the wiring portion 580 may include one or more wiring members 581, for example, a plurality of wiring members 581.

According to some example embodiments, the plurality of wiring portions 580 may be positioned in the peripheral area PDA, and for example, two wiring portions 580 may be positioned at both sides of the pad portion 570 between the two wiring portions 580.

At least one wiring member 581 of the wiring portion 580 may be electrically connected to one region of the display area DA.

The first treatment area LA and the second treatment areas CA1 and CA2 may correspond to at least one side surface of the substrate 501.

Also, for example, the first treatment area LA and the second treatment areas CA1 and CA2 may be formed in the peripheral area PDA. According to some example embodiments, the first treatment area LA and the second treatment areas CA1 and CA2 may be positioned at side surfaces of an edge including the peripheral area PDA among the edges of the substrate 501.

Two, second treatment areas CA1 and CA2 may be apart from each other, and each of the second treatment areas CA1 and CA2 may be adjacent to the first treatment area LA so as to be connected to the first treatment area LA.

Also, the first treatment area LA may be between the two second treatment areas CA1 and CA2.

According to some example embodiments, edges of the two second treatment areas CA1 and CA2 may not be in parallel to edges of the first treatment area LA but may be bent at a certain angle. For example, an angle formed between edges of the two second treatment areas CA1 and CA2 and edges of the first treatment area LA may be greater than 90 degrees and less than 180 degrees.

Thus, when the second treatment areas CA1 and CA2 are formed, the effect of the first treatment area LA may be reduced. In an alternative embodiment, damage of the already-formed first treatment area LA may be reduced.

Also, a position of the wiring portion 580 of the display apparatus 500 may be easily displayed.

Figure 28:
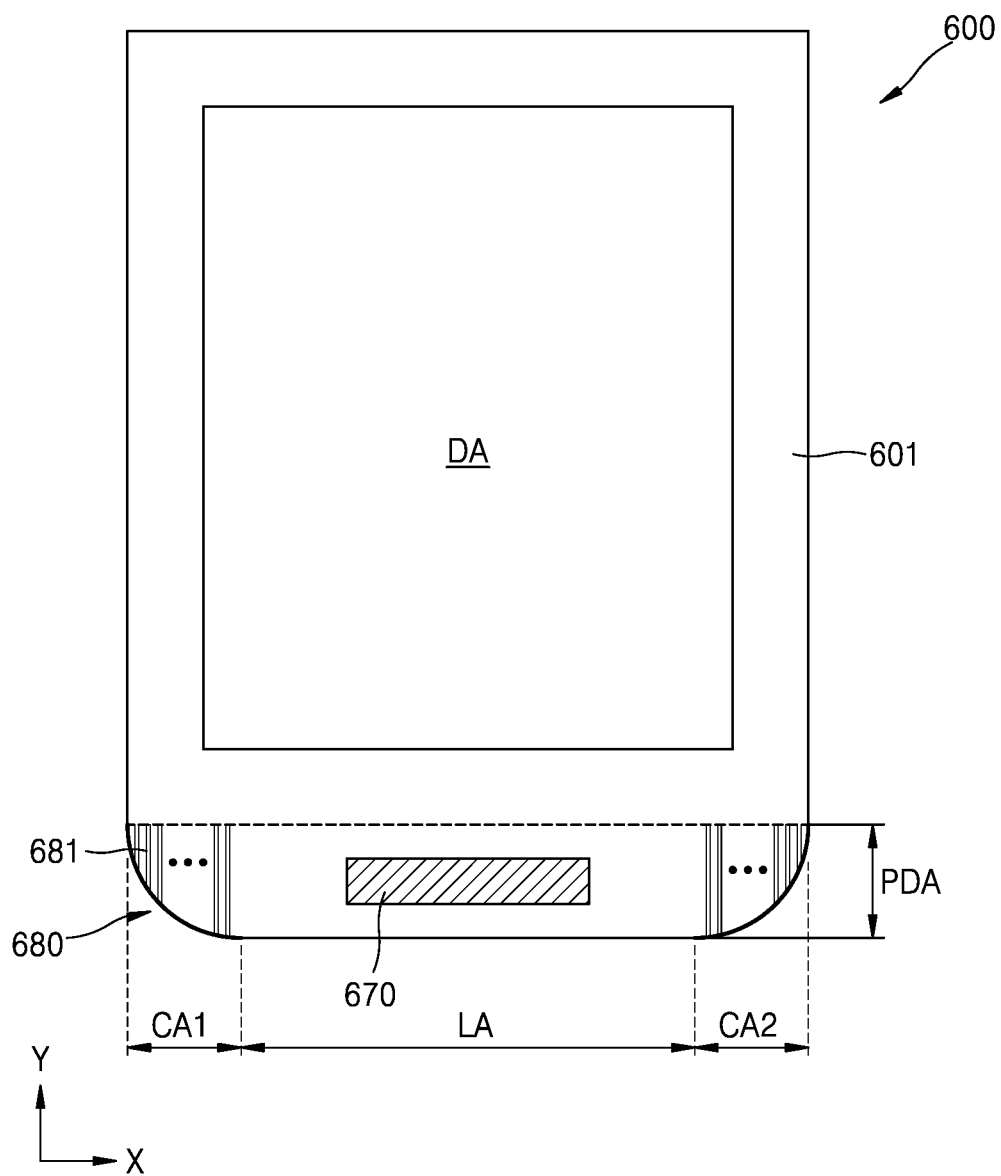
FIG. 28 is a plan view illustrating a display apparatus according to some example embodiments.

FIG. 28 is a plan view illustrating a display apparatus according to some example embodiments.

Referring to FIG. 28, a display apparatus 600 may include a substrate 601, a display portion, a first treatment area LA, and second treatment areas CA1 and CA2.

A display area DA may be defined on the substrate 601. The display portion may be positioned in the display area DA and may include at least display device, for example, an OLED.

A peripheral area PDA may be defined on the substrate 601, and the peripheral area PDA may not overlap the display area DA. The peripheral area PDA may be a non-display area, and according to some example embodiments, the peripheral area PDA may include an area in which one or more pad portions 670 are positioned.

The pad portion 670 may be electrically connected to at least one region of the display area DA.

The peripheral area PDA may include edges of one side surface of the substrate 601.

One or more wiring portions 680 may be formed in the peripheral area PDA, and the wiring portion 680 may include one or more wiring members 681, for example, a plurality of wiring members 681.

According to some example embodiments, a plurality of wiring portions 680 may be positioned in the peripheral area PDA. For example, two wiring portions 680 may be positioned at both sides of the pad portion 670 between the two wiring portions 680.

At least one wiring member 681 of the wiring portion 680 may be electrically connected to one region of the display area DA.

The first treatment area LA and the second treatment areas CA1 and CA2 may correspond to at least one side surface of the substrate 601.

Also, for example, the first treatment area LA and the second treatment areas CA1 and CA2 may be formed in the peripheral area PDA. According to some example embodiments, the first treatment area LA and the second treatment areas CA1 and CA2 may be positioned at side surfaces of an edge including the peripheral area PDA among edges of the substrate 601.

Two, second treatment areas CA1 and CA2 may be apart from each other, and each of the two second treatment areas CA1 and CA2 may be adjacent to the first treatment area LA so as to be connected to the first treatment area LA.

Also, the first treatment area LA may be positioned between the two second treatment areas CA1 and CA2.

According to some example embodiments, edges of the two second treatment areas CA1 and CA2 may not be in parallel to edges of the first treatment area LA but may be curved at a certain angle.

Thus, when the second treatment areas CA1 and CA2 are formed, the effect of the first treatment area LA may be reduced, and according to some example embodiments, damage of the already-formed first treatment area LA may be reduced.

Also, the position of the wiring portion 680 of the display apparatus 600 may be easily displayed.

Also, the edges of the second treatment areas CA1 and CA2 may include curves. For example, the second treatment surface of the second treatment areas CA1 and CA2 may include a curved surface based on a direction that crosses the thickness direction of the substrate 601.

Through a structure including the curved surface of the second treatment areas CA1 and CA2, damage such as the occurrence of cracks at the edges of the display apparatus 600 may be reduced.

Also, the entire esthetic sense of the display apparatus 600 may be improved, and the display apparatus 600 may be easily applied to various sets and cases.

Figure 29:
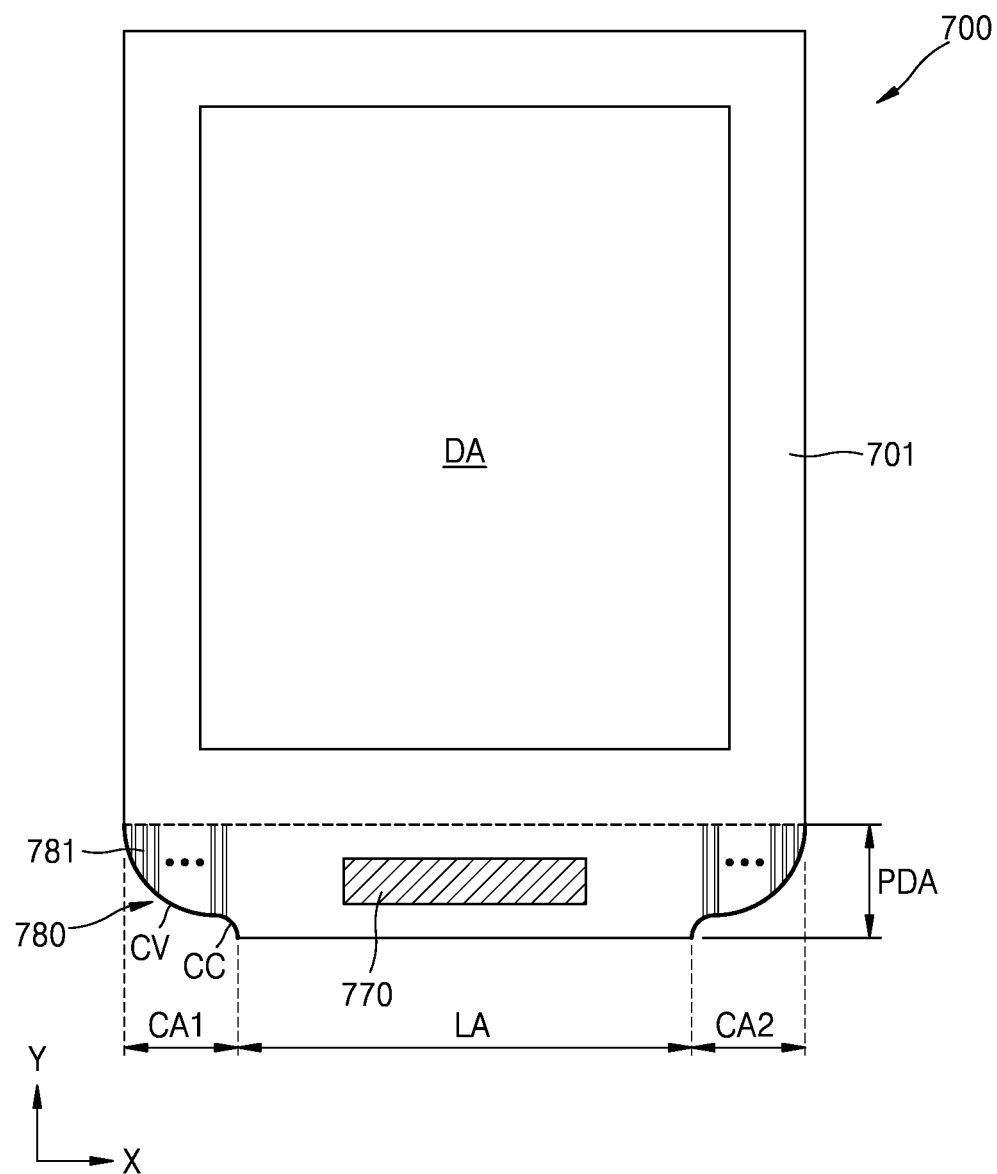
FIG. 29 is a plan view illustrating a display apparatus according to some example embodiments.

FIG. 29 is a plan view illustrating a display apparatus according to some example embodiments.

Referring to FIG. 29, a display apparatus 700 may include a substrate 701, a display portion, a first treatment area LA, and second treatment areas CA1 and CA2.

A display area DA may be defined on the substrate 701. A display portion may be positioned in the display area DA and may include at least a display device, for example, an OLED.

A peripheral area PDA may be defined on the substrate 701. The peripheral area PDA may not overlap the display area DA. The peripheral area PDA may be a non-display area, and according to some example embodiments, the peripheral area PDA may include a region in which one or more pad portions 770 are positioned.

The pad portion 770 may be electrically connected to at least one region of the display area DA.

The peripheral area PDA may include edges of one side surface of the substrate 701.

One or more wiring portions 780 may be formed in the peripheral area PDA. The one or more wiring portions 780 may include one or more wiring members 781, for example, a plurality of wiring members 781.

According to some example embodiments, a plurality of wiring portions 780 may be positioned in the peripheral area PDA and for example, may be positioned at both sides of the pad portion 770 between the two wiring portions 780.

At least one wiring member 781 of the wiring portions 780 may be electrically connected to one region of the display area DA.

The first treatment area LA and the second treatment areas CA1 and CA2 may correspond to at least one side surface of the substrate 701.

Also, for example, the first treatment area LA and the second treatment areas CA1 and CA2 may be formed in the peripheral area PDA. According to some example embodiments, the first treatment area LA and the second treatment areas CA1 and CA2 may be positioned at side surfaces of an edge including the peripheral area PDA among edges of the substrate 701.

Additionally, second treatment areas CA1 and CA2 may be apart from each other, and each of the two second treatment areas CA1 and CA2 may be adjacent to the first treatment area LA so as to be connected to the first treatment area LA.

Also, the first treatment area LA may be positioned between the two second treatment areas CA1 and CA2.

According to some example embodiments, edges of the two second treatment areas CA1 and CA2 may not be in parallel to edges of the first treatment area LA but may be curved at a certain angle.

Also, the edges of the second treatment areas CA1 and CA2 may include curves. For example, the second treatment surface of the second treatment areas CA1 and CA2 may include a curved surface based on a direction that crosses the thickness direction of the substrate 701.

For example, the edges of the second treatment areas CA1 and CA2 may include curves and a convex line CV and concave line CC. The convex line CV may have a convex shape based on the display area DA, for example, a shape of a curve being gradually far away from the display area DA. The concave line CC may be connected to the convex line CV and may a concave shape based on the display area DA, for example, a shape of a curve being gradually closer to the display area DA. Thus, a rapid change at ends of the wiring members 781 of the wiring portions 780 may be reduced so that durability of the display apparatus 700 may be improved.

Also, according to some example embodiments, a region in which the pad portion 770 is positioned, may easily protrude from other regions so that the pad portion 770 may be easily applied to various mechanical components and cases of the display apparatus 700.

Figure 30:
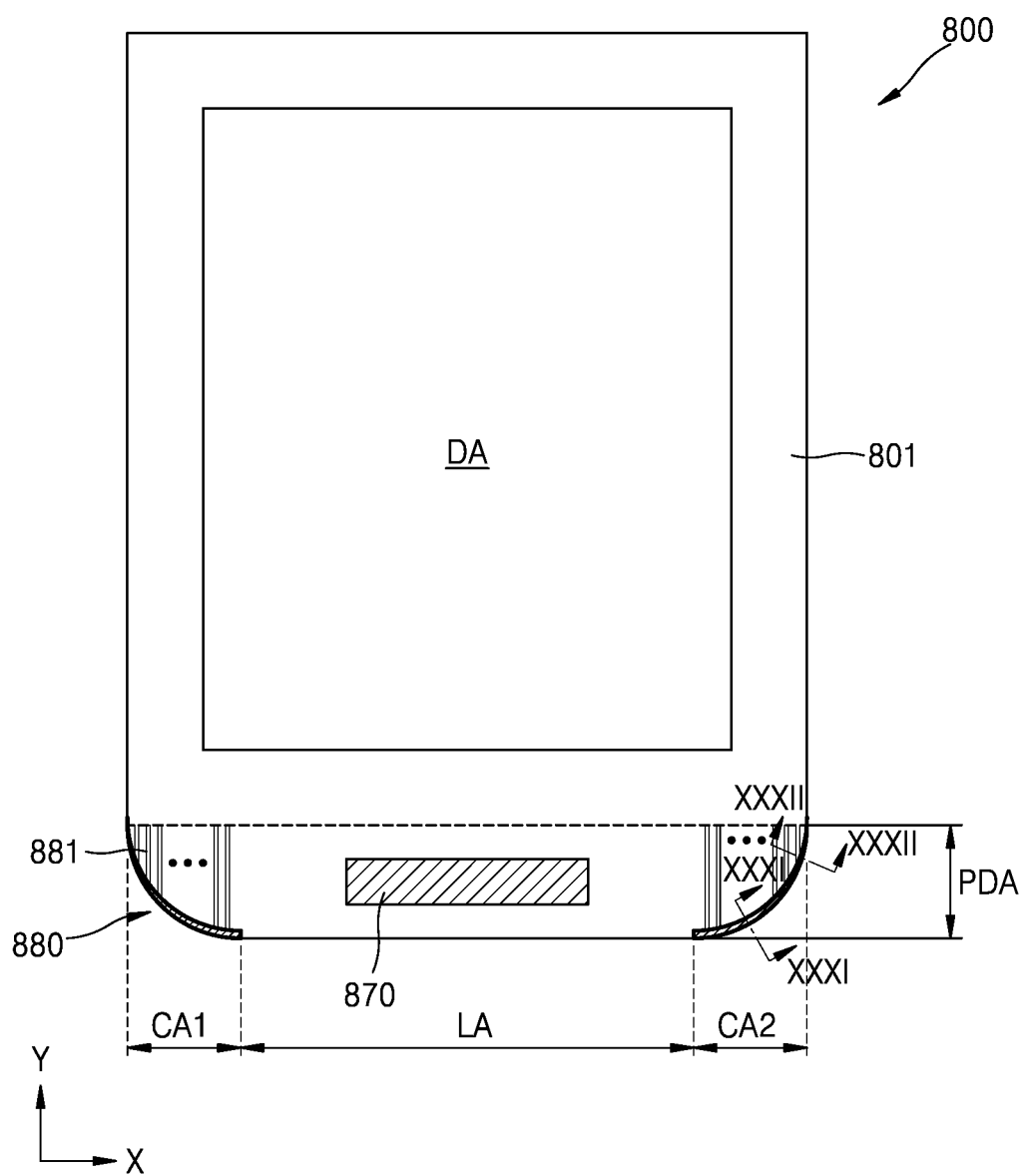
FIG. 30 is a plan view illustrating a display apparatus according to some example embodiments.
Figure 31:
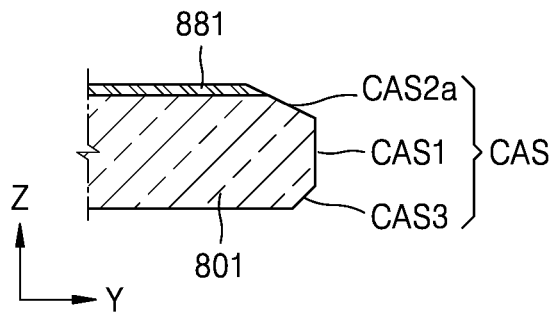
FIG. 31 is a cross-sectional view taken along a line XXXI-XXXI of FIG. 30.
Figure 32:
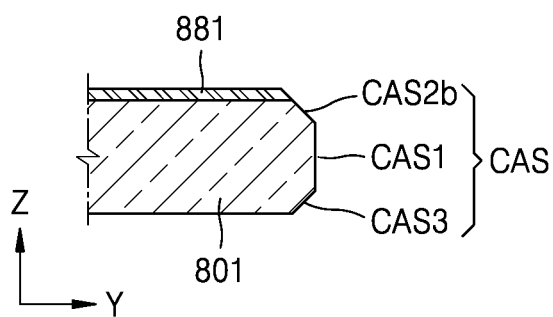
FIG. 32 is a cross-sectional view taken along a line XXXII-XXXII of FIG. 30.
Figure 33:
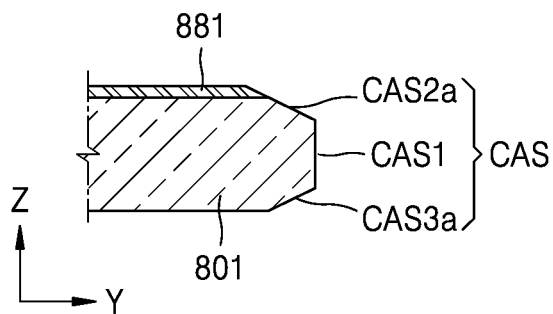
FIG. 33 is a view illustrating a modified embodiment of FIG. 31.

FIG. 30 is a plan view illustrating a display apparatus according to some example embodiments, FIG. 31 is a cross-sectional view taken along a line XXXI-XXXI of FIG. 30, FIG. 32 is a cross-sectional view taken along a line XXXII-XXXII of FIG. 30, and FIG. 33 is a view illustrating a modified embodiment of FIG. 31.

Referring to FIG. 29, a display apparatus 800 may include a substrate 801, a display portion, a first treatment area LA, and second treatment areas CA1 and CA2.

A display area DA may be defined on the substrate 801. A display portion may be positioned in the display area DA. The display portion may include at least a display device, for example, an OLED.

A peripheral area PDA may be defined on the substrate 801. The peripheral area PDA may not overlap the display area DA. The peripheral area PDA may be a non-display area, and in an alternative embodiment, the peripheral area PDA may include a region in which one or more pad portions 870 are positioned.

The pad portion 870 may be electrically connected to at least one region of the display portion DA.

The peripheral area PDA may include edges of one side surface of the substrate 801.

One or more wiring portions 880 may be formed in the peripheral area PDA. The wiring portion 880 may include one or more wiring members 881, for example, a plurality of wiring members 881.

According to some example embodiments, a plurality of wiring portions 880 may be positioned in the peripheral area PDA, and for example, two wiring portions 880 may be positioned at both sides of the pad portion 870 between the two wiring portions 880.

At least one wiring member 881 of the wiring portions 880 may be electrically connected to one region of the display area DA.

The first treatment area LA and the second treatment areas CA1 and CA2 may correspond to at least one side surface of the substrate 801.

Also, for example, the first treatment area LA and the second treatment areas CA1 and CA2 may be formed in the peripheral area PDA. In a specific example, the first treatment area LA and the second treatment areas CA1 and CA2 may be positioned at a side surface of edges including the peripheral area PDA among edges of the substrate 801.

Two, second treatment areas CA1 and CA2 may be apart from each other, and each of the two second treatment areas CA1 and CA2 may be adjacent to the first treatment area LA so as to be connected to the first treatment area LA.

Also, the first treatment area LA may be positioned between the two second treatment areas CA1 and CA2.

According to some example embodiments, the second treatment area CA may include a second treatment surface CAS, and the second treatment surface CAS may include a center treatment surface CAS1 and a first connection treatment surface CAS2a.

Also, according to some example embodiments, the second treatment surface CAS may include a second connection treatment surface CAS3.

A width of the first connection treatment surface CAS2a may be determined in various ways. For example, the width of the first connection treatment surface CAS2a may be a width based on a direction far away from the center treatment surface CAS1 and for example, may be a width of polishing when a polishing treatment process is performed.

The width of the first connection treatment surface CAS2a may be increased so that the amount of polishing of the wiring members 881 may be increased and defect reduction characteristics of the display apparatus may be improved.

According to some example embodiments, the width of the first connection treatment surface CAS2a may be different from a width of the second connection treatment surface CAS3 and for example, may be greater than the width of the second connection treatment surface CAS3. Thus, the efficiency of a polishing process may be improved.

According to some example embodiments, as shown in FIG. 33, the amount of polishing on the second connection treatment surface CAS3a may be increased so that the width of the second connection treatment surface CAS3a may be the same as the width of the first connection treatment surface CAS2a.

In addition, according to some example embodiments, as shown from a difference between FIGS. 31 and 32, the width of the first connection treatment surface CAS2a may be different from the width of the first connection treatment surface CAS2b of FIG. 32. For example, the first connection treatment surface CAS2a of FIG. 31 may be a large polished area, and the first connection treatment CAS2b may be a small polished area.

Thus, the amount of polishing on a certain region within the second treatment area may be increased, and for example, the amount of polishing may be increased in a region in which a large number of wiring members of the wiring portion are positioned, so that the width of the first connection treatment surface may be increased.

According to some example embodiments, edges of the two second treatment areas CA1 and CA2 may not be in parallel to the edges of the first treatment area LA but may be curved at a certain angle.

In addition, edges of the second treatment areas CA1 and CA2 may include curves. For example, the second treatment surface of the second treatment areas CA1 and CA2 may include a curved surface based on the direction that crosses the thickness direction of the substrate 801.

Through a structure including the curved surfaces of the second treatment areas CA1 and CA2, damage such as the occurrence of cracks at the edges of the display apparatus 800 may be reduced.

The particular implementations shown and described herein are illustrative examples of one or more embodiments and are not intended to otherwise limit the scope of one or more embodiments in any way. Moreover, no item or component is essential to the practice of one or more embodiments unless the element is specifically described as "essential" or "critical".

The use of the terms "a" and "an" and "the" and similar referents in the context of describing one or more embodiments (especially in the context of the following claims) are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the steps of all methods described herein may be performed in any suitable order unless otherwise indicated herein or otherwise clearly contradicted by context. The use of any and all examples, or exemplary language (e.g., "such as") provided herein, is intended merely to better illuminate one or more embodiments and does not pose a limitation on the scope of one or more embodiments unless otherwise claimed. Numerous modifications and adaptations will be readily apparent to those skilled in this art without departing from the spirit and scope of one or more embodiments.

As described above, in a display apparatus and a method of manufacturing the display apparatus according to embodiments, the display apparatus having improved electrical characteristics and picture quality characteristics may be easily provided, and the efficiency of a manufacturing process may be improved.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:
 a substrate including a first surface, a second surface, and a third surface, the first surface being parallel to a first direction and a second direction intersecting the first direction, the second surface being opposite to the first surface, and the third surface connecting the first surface to the second surface in a third direction intersecting the first direction and the second direction;
 a display portion arranged on the first surface of the substrate;
 a first treatment area including a first treatment surface, the first treatment surface being arranged on the third surface of the substrate and extending in the first direction; and
 a second treatment area including a second treatment surface, the second treatment surface being arranged on the third surface of the substrate, being connected to the first treatment surface in the first direction, and having a different surface shape from the first treatment surface,
 wherein,
 the second treatment surface includes a center treatment surface and a connection treatment surface that is closer to the first surface of the substrate than the center treatment surface, and
 an angle between the connection treatment surface and the first surface is greater than an angle between an extension line of the connection treatment surface and the first surface.

2. The display apparatus of claim 1, wherein the first treatment surface and the second treatment surface are directly connected to each other in the first direction.

3. The display apparatus of claim 1, wherein the first treatment surface and the second treatment surface correspond to a whole thickness of the substrate.

4. The display apparatus of claim 1, wherein the first treatment surface and the second treatment surface are formed using different treatment methods.

5. The display apparatus of claim 1, further comprising one or more insulating layers on the substrate, wherein the first treatment surface or the second treatment surface is connected to the one or more insulating layers.

6. The display apparatus of claim 1, further comprising one or more conductive layers on the substrate, wherein the first treatment surface or the second treatment surface is connected to the one or more conductive layers.

7. The display apparatus of claim 1, wherein an angle between the connection treatment surface and the first surface is greater than 90 degrees.

8. The display apparatus of claim 1, wherein a plurality of second treatment areas are formed.

9. The display apparatus of claim 8, wherein two second treatment areas among the plurality of second treatment areas are at both sides of the first treatment area between the two second treatment areas.

10. The display apparatus of claim 1, wherein a peripheral area is on the third surface of the substrate and does not overlap a display area of the display apparatus, and the first treatment area and the second treatment area correspond to the peripheral area.

11. The display apparatus of claim 10, further comprising one or more pad portions in the peripheral area.

12. The display apparatus of claim 10, wherein a wiring portion is in the peripheral area and comprises one or more wiring members.

* * * * *